US011095253B2

(12) United States Patent
Carvalho et al.

(10) Patent No.: US 11,095,253 B2
(45) Date of Patent: Aug. 17, 2021

(54) ANALOG TO ANALOG CONVERTER WITH QUANTIZED DIGITAL CONTROLLED AMPLIFICATION

(71) Applicants: Paulo Carvalho, Lisbon (PT); Rui Dinis, Costa da Caparica (PT); João Oliveira, Parede (PT)

(72) Inventors: Paulo Carvalho, Lisbon (PT); Rui Dinis, Costa da Caparica (PT); João Oliveira, Parede (PT)

( * ) Notice: Subject to any disclaimer, the term of this patent is extended or adjusted under 35 U.S.C. 154(b) by 0 days.

(21) Appl. No.: 16/842,240

(22) PCT Filed: Oct. 2, 2018

(86) PCT No.: PCT/PT2018/000019
§ 371 (c)(1),
(2) Date: Apr. 7, 2020

(87) PCT Pub. No.: WO2019/074384
PCT Pub. Date: Apr. 18, 2019

(65) Prior Publication Data
US 2020/0366245 A1 Nov. 19, 2020

(30) Foreign Application Priority Data
Oct. 10, 2017 (PT) .......................................... 110339

(51) Int. Cl.
H03F 1/02 (2006.01)
H03F 3/217 (2006.01)
H03M 1/00 (2006.01)

(52) U.S. Cl.
CPC .......... *H03F 1/0205* (2013.01); *H03F 3/2171* (2013.01); *H03F 3/2176* (2013.01); *H03M 1/001* (2013.01); *H03F 2200/102* (2013.01); *H03F 2200/451* (2013.01)

(58) Field of Classification Search
CPC .................................... H03F 1/02; H03F 1/07
USPC ............................................... 330/124 R, 295
See application file for complete search history.

(56) References Cited

U.S. PATENT DOCUMENTS 7,526,261 B2 * 4/2009 Sorrells .................... H03C 5/00
455/127.3

* cited by examiner

Primary Examiner — Henry Choe

(57) ABSTRACT

Methods and systems for power amplification of time varying envelope signals are disclosed herein. In one embodiment, a plurality of signals with constant envelope generated from the decomposition of the quantized version of a time varying envelope signal are individually amplified and then summed to form a desired time-varying envelope signal. Amplitude, phase and frequency characteristics of one or more of the constituent signals are controlled to provide the desired phase, frequency, and/or amplitude characteristics of the desired time varying envelope signal. In another embodiment, a time-varying envelope signal is decomposed into in-phase and quadrature components that are quantized and decomposed into a plurality of quasi constant or constant envelope constituent signals. The constituent signals are amplified, and then summed to construct an amplified version of the original time-varying envelope signal. The signal amplifiers may be Class A, B, AB, C, D, Class F or Class S amplifiers to provide high amplification efficiency.

25 Claims, 13 Drawing Sheets

ANALOG TO ANALOG CONVERTER WITH QUANTIZED DIGITAL CONTROLLED AMPLIFICATION

BACKGROUND OF THE INVENTION

Field of the Invention

The present invention relates generally to single carrier and multi-carrier modulations and power amplification. More particularly, the invention relates to methods and apparatus for linear power amplification of time varying envelope signals.

Description of Related Art

In power amplifiers, a complex tradeoff typically exists between linearity and power efficiency. Linearity is determined by a power amplifier's operating range on a characteristic curve that relates its input to output variables—the more linear the operating range the more linear the power amplifier (PA) is said to be. Linearity is a desired characteristic of a PA. In one aspect, for example, it is desired that a power amplifier uniformly amplifies signals of varying amplitude, and/or phase and/or frequency. Accordingly, linearity is an important determiner of the output signal quality of a power amplifier.

Power efficiency can be calculated using the relationship of the total power delivered to a load divided by the total power supplied to the amplifier. For an ideal amplifier, power efficiency is 100%. Typically, power amplifiers are divided into classes which determine the amplifier's maximum theoretical power efficiency. Power efficiency is clearly a desired characteristic of a power amplifier, particularly in wireless communication systems where power consumption is significantly dominated by the power amplifier.

The efficiency of a radio frequency (RF) power amplifier has a significant impact on the battery life of a portable device, such as a portable transmitter, because the amplifier typically consumes the most amount of power used by the device. Unfortunately, the traditional tradeoff between linearity and efficiency in power amplifiers is such that the more linear a power amplifier is the less power efficient it is. For example, the most linear amplifier is biased for class A operation, which is the least efficient class of amplifiers. Efficient power amplifiers are therefore highly desirable. Efficient class C, D, E, F and S PAs are more power efficient, but are considerably non linear which can result in spectrally distorted output signals. However, many recent transmitter designs require a non-constant amplitude RF output to maximize the data rate within a given channel bandwidth.

The tradeoff described above is further accentuated by modern wired and wireless communications systems with strictly requirements regarding spectral and power efficiencies. For example, wireless communication signals, such as orthogonal frequency-division multiplexing (OFDM) [1], coded division multiple access (CDMA) [2], wide band CDMA (W-CDMA), single carrier with frequency domain equalization (SC-FDE) [3] and orthogonal Frequency division multiple access (OFDMA), are characterized by envelope fluctuations and high peak-to-average power ratios (PAPR), which may compromise amplification efficiency [4, 5, 6]. The larger the signal's PAPR the more non-linear distortion will be produced when non-linear amplifiers are employed. Other multi-carrier techniques such as filter bank multi-carrier with offset quadrature amplitude modulation (FBMC-OQAM) have same drawback.

A suitable linear RF amplifier may be manufactured using gallium arsenide (GaAs) devices. However, gallium arsenide devices are presently considered too expensive for many applications. While metal oxidesemiconductor (MOS) is the preferred process for manufacturing semiconductor devices, due to its low cost of fabrication and high yields, MOS has traditionally been unsuitable for fabricating linear RF amplifiers due to its lack of linearity when used to implement a high efficiency amplifier. Such poor linearity introduces a significant amount of distortion into the amplifier's output signal.

Many different linearization schemes have been proposed in the art to achieve a linear and efficient power amplifier. One concept that has been explored for achieving both linear operation and high efficiency is referred to as outphasing. This technique is also sometimes referred to as "Linear Amplification with Nonlinear Components" or LINC. In the documents [7-12] a LINC is disclosed. Also documents [13] and [14] disclose an amplification processes based on the same principle. This technique separates the input signal s(t) in two constant envelope signals to be amplified separately by two highly efficient non linear (NL) amplifiers (e.g., class D and E amplifiers). In conventional LINC, an input signal S(t) with a time varying envelope is decomposed into two constant amplitude signals $S_1(t)$, $S_2(t)$ which can be summed to provide a desired output signal $S_{out}(t)$. A time varying envelope output signal is created as the sum of two constant-envelope signals $S_1(t)$, $S_2(t)$ by outphasing of the two constant envelope signals. Because the two signals $S_1(t)$, $S_2(t)$ are of constant amplitude, they can be synthesized with highly-efficient PAs including partially and fully switched mode designs such as classes D, E, F, E/F and current-mode D, Inverse F, $\phi$, etc. These amplifiers can be made highly efficient, in part, because they needn't have the capability to provide linear output control. Combining the two constant amplitude outputs $S_1(t)$, $S_2(t)$ in a power combining network enables the net output amplitude to be controlled via the relative phase of the two constituent components $S_1(t)$, $S_2(t)$.

The LINC transmitter scheme is limited by the envelope characteristics of its input signal. Since the amplitude information of the band-limited signal is embedded in the phase of the LINC components, a highly fluctuating envelope produces a constant envelope LINC component with high phase content, which is what causes the LINC components' spectrum to spread. Other problem with LINC is how the power combining is done, particularly because many high efficiency power amplifiers are highly sensitive to load impedance, and their performance and efficiency can heavily degrade due to interactions between the power amplifiers. One conventional approach is to combine the constant-amplitude signals $S_1(t)$, $S_2(t)$ using an isolating combiner. An isolating combiner provides constant (resistive) loading impedance to each PA independent of the outphasing angle, eliminating any interactions. A consequence of this, however, is that each PA operates at a constant output power level. Power that is not delivered to the output must instead be delivered elsewhere, usually to an "isolation" resistor R which dissipates power in the form of heat. Thus, a portion of the total constant output power from the PAs is delivered to the output (at the sum port of the combiner); the remainder is delivered to the difference port and is lost as heat in the isolation resistor. This leads to a rapid degradation of efficiency as output power is decreased, diminishing the attractiveness of this approach. This problem can be partially offset by recovering power not delivered to the output through a rectifier. Thus, in some implementations, power not delivered to the output is instead recovered back to the dc supply via a rectifier.

Document [15] discloses an amplification method where a time-varying input signal $S_{in}(t)$ is decomposed into two constant amplitude signals $S_1(t)$, $S_2(t)$ which can be summed to provide a desired output signal $S_{out}(t)$. A variable envelope output signal is created as the sum of two constant envelope signals $S_1(t)$, $S_2(t)$ by outphasing of the two constant envelope signals. A lossless combiner is used, such as a Chireix combiner that overcomes the loss and reactive loading problems of previous outphasing approaches by providing ideally lossless power combining, along with substantially resistive loading of the individual power amplifiers over a very wide output power range. Contrarily to the method disclosed in [15], in the amplification disclosed in present application the variable envelope output signal is created as a sum of a plurality of constant envelope constituent signals of each quantized sample of the complex envelope of the input signal.

Document [16] discloses a LINC transmitter, which employs a look-up table (LUT) based ringtype magnitude modulation (RMM) method to confine the envelope of an offset quadrature phase shift keying (OQPSK) signal that is fed to the LINC structure between two specified boundaries. It is shown that by reducing the envelope's dynamic range, the broad LINC components' spectrum is significantly narrowed, thus allowing to combine efficiently the LINC components using a passive combiner, which guarantees a band limited reconstructed signal. Contrarily to the method disclosed in [16] the amplification embodiments disclosed in present application do not need to reduce the dynamic range of the time domain samples of the analog signal, since there is no dependence of the spectrum of the quantized amplified signal to the dynamic range of the time domain samples. Only the size of the quantization constellation may depend on the dynamic range of the quantizer inputs, since the size of the quantization alphabet can be adjusted according to the dynamic range and the intended $\varepsilon_{QT}$ or the desired signal to interference ratio (SIR) of the quantized signal. Contrarily to LINC there is no spectrum spread in the $N_m \leq N_b$ components of the quantized signal, since their bandwidth depends only on the pulse shape adopted in each modulator. Neither the amplitude information of the band limited signal is embedded in the phase of the $N_m \leq N_b$ components, since they are defined as a function of the quantization symbols of the quantization constellation that is adopted, for each signal, according to the dynamic range of the time domain samples of the multi carrier (MC) input signal or single carrier (SC) input signal and the intended quantization error $\varepsilon_{QT}$.

Document [17] discloses arrangements for paralleling amplifiers for increased output power, and more particularly arrangements which combine power in a hybrid power combiner including sum and difference ports, and which control the phase of the signals being combined in response to the power level at the difference port. Source signals are divided into two nominally equal amplitude, mutually quadrature-phase signal portions, being each amplified by one of signal paths. The amplified signals are applied to power combiner, which produces a signal at combined output port which represents the combined power of the two amplified signals applied to its inputs, so long as those signals are nominally in phase.

Document [18] discloses an amplification circuit that uses a combiner with dual parallel signal amplifiers feeding it. As in other Chireix architectures, the signals from the signal amplifiers are phase modulated prior to being fed to the combiner. The combiner then combines these two signals and, depending on how these two signals are phase modulated, the resulting output of the combiner is amplitude modulated as well as phase modulated. Class D or class F power amplifiers are used to provide the desirably very low output impedances that allows the Chireix architecture to amplify both phase and amplitude modulated signals. Such a configuration may use multiple parallel signal amplifiers of the same type or class, with all parallel signal amplifiers feeding a single multiple input port combiner.

Other outphasing amplification method is disclosed in document [19], where in-phase and quadrature components of the input signal are decomposed into several constant envelope components. The variable envelope output signal is created as a sum of several constant envelope signals by outphasing the several pairs of constant envelope signals. As traditional LINC schemes the phase between the constituent signals depends on the desired value of the variable envelope of the output signal.

In [20] is disclosed a polar modulation technique that simultaneously achieves linearity and efficiency in an RF power amplifier. In this approach, an RF input signal is decomposed into its polar components, i.e., phase and magnitude. These two polar components are amplified independently and then are recombined to generate an amplified linear RF output signal. The phase component of the RF input signal is typically amplified by a constant-amplitude amplifier that is optimized for efficiency. The magnitude or envelope component of the RF input signal is typically amplified by a switching-mode power supply that operates as the power supply for at least the output stage of the constant amplitude amplifier. Various approaches to the use of polar modulation have been described in [21] and [22].

In [23] it is disclosed a method that allows to represent the variable envelope signals associated to large constellations as the sum of several polar components, that are amplified and transmitted by a separate antenna. The power amplification apparatus proposed in this application follows a different approach since it is applied to the quantized values of the time domain samples of the signal's envelope. Therefore, the quantization's constellation should be defined in terms of the dynamic range of the time domain signal's samples and the maximum intended quantization error $\varepsilon_{QT}$ in the quantization process. Since in MC modulations the dynamic range of the envelope depends on the number of sub-carriers and the modulation adopted for each sub-carrier and in SC depends on the adopted modulation, the quantization alphabet symbol $\mathfrak{S} = \{s_0, s_1, \ldots, s_{M-1}\}$, may vary with the number of sub-carriers and modulation adopted and the size of the alphabet $M = 2^{N_b}$ only depends on number of quantization bits. Thus, there is no a direct relation between the quantization constellation and the modulation applied to signal whose time domain samples are quantized. Hence, the amplification process disclosed here implements a linear amplification of a signal with a time varying envelope through the transformation of the time domain samples' values into a quantized value and the decomposition of the quantized symbol as a sum of quasi constant or constant envelope signals that can be amplified by nonlinear amplifiers. Moreover, since the quantizer's inputs are the time domain samples of a signal's envelope, this decomposition can be applied to any signal and does not have a specific constellation as a target.

In [24] it is disclosed a method of transmitting data based on an M-quadrature amplitude modulation (M-QAM) with linear amplification using nonlinear amplifiers. Main difference lies on the fact that the power amplification disclosed in the present application is not restricted to a particular modulation or constellation, and can be applied to any signal with a time varying envelope, since it quantizes the values of the samples of the input signal and decomposes these quantized versions into a plurality of constituent signals that are amplified separately. Also in the amplification method disclosed in this application the number of polar components as well as the quantization error $\varepsilon_{QT}$ is defined in terms of the dynamic range of the signal's envelope.

In [25] are disclosed methods for nonlinear coded 16-OQAM schemes, based on two nonlinear OQPSK signals specially designed to allow higher amplification efficiency due to its robustness against nonlinear distortions. The power amplification apparatus disclosed in the present application implements the linear amplification of signals with a variant envelope through the transformation of the time domain samples' values of the signal's envelope into a quantized signal that can be represented as a sum of a plurality of constant or quasi constant envelope signals that can be amplified by nonlinear amplifiers. Thus, since it can be employed to any set of samples of a time varying envelope signal, the power amplification apparatus of the present application does not have any format constraints associated to the pulse shapes and durations that affect the decomposition done in [25], neither nonlinear distortion. Also the number of components is not limited by two, since it is only defined by the number of quantization bits $N_b$ used during the quantization of the signal's samples.

Document [26] discloses a power amplification apparatus based on one amplifier that performs an inverse fast Fourier transformation on data allocated to a plurality of sub-carriers, converts time-domain data output in parallel from the inverse fast Fourier transformation into a time-domain analog signal, and performs a power amplification of the time-domain analog signal, with saturation output level of the power amplification adjustable in accordance with a switching signal. The amplification apparatus disclosed in this application is rather different, since it performs a linear amplification of each constituent signal in which the quantized values of the samples $s(t=nT_s)=s(n)$ are decomposed. Thus, all the amplifiers have a fixed saturation output level in accordance with the value of the constituent signal that they amplify. In [26] the disclosed power amplification apparatus performs an inverse fast Fourier transform (IFFT) on data allocated to a plurality of sub-carriers, converts time domain data output in parallel from IFFT into time domain analog signal which is amplified by an amplifier with the saturation level controlled by a switching signal. For each block the amplitude is compared with a previous threshold and the saturation output is adjusted based on an output comparison result. Contrarily to the amplification apparatus disclosed in this application no quantization is used to quantize the in-phase and quadrature values of the envelope and each component is directly amplified by an amplifier with a saturation level controlled by a switching signal. Nonlinear distortion due power amplification still is minimized by controlling dynamically the saturation level of the amplifiers employed in the amplification of the real and imaginary parts of the signal. There is no quantization of the real and imaginary parts of the input signal and neither the decomposition of the quantized values into a sum of constant envelope signals that are amplified with nonlinear amplifiers.

In [27] it is disclosed a super linear feedforward amplifier, where nonlinear effects are compensated through an error cancelation circuit loop, that subtracts the error from the amplified signals to generate a linearized output. An equalization it is also applied to the amplified signals to correct gain and phase distortions introduced by the power amplifier. It is employed a digital correction block controlled adaptively by feedback signals, received from the signal to be amplified and error cancelation loops. No feedback loop and equalization are employed in the amplification apparatus disclosed in the present application, since distortion effects due to amplification are avoided by the decomposition of the signals into constant envelope components that are amplified by nonlinear amplifiers. A finite set of values for the envelope of the input signal is also obtained through a quantizer. Contrarily to the apparatus of [28] in the amplification apparatus disclosed in the present application, distortion effects are only due to the quantization error associated to the quantized values used to represent the in-phase and quadrature components of the input signal.

INFORMATION DISCLOSURE STATEMENTS

Patents and publications relevant to the patentability of the instant claims, concerning a analog to analog converter with quantized digital controlled amplification.

[1] R. v. Nee and R. Prasad, OFDM for Wireless Multimedia Communications, 1st ed. Norwood, Mass., USA: Artech House, Inc., 2000.

[2] Hsiao-Hwa Chen, The next generation of CDMA techniques, John Wiley & Sons, 2007.

[3] D. Falconer, S. Ariyavisitakul, A. Benyamin-Seeyar, and B. Eidson, "Frequency Domain Equalization for Single-Carrier Broadband Wireless Systems", IEEE Comm. Mag., vol. 4, no. 4, pp. 58-66, April 2002.

[4] L. Zhang, L.-L. Kuang, Z.-Y. Ni, and J.-H. Lu, "Performance evaluation for OFDM and SC-FDE systems with high power amplifier", in IET International Communication Conference on Wireless Mobile and Computing (CCWMC 2009), December 2009, pp. 348-352.

[5] Robert Wolf, Frank Ellinger, and Ralf Eickhoff, "On the Maximum Efficiency of Power Amplifiers in OFDM Broadcast Systems with Envelope Following", in proc. of Mobilight 2010: Mobile Lightweight Wireless Systems, pp. 160-170.

[6] O. Abel Gouba, Yves Louet, "Theoretical analysis of the trade-off between efficiency and linearity of the High Power Amplifier in OFDM context", EW 2012, April 2012, Poznan, Poland, 2012.

[7] D. Cox, "Linear amplification with nonlinear components", IEEE Transactions on Communications, vol. 22, no. 12, pp. 1942-1945, December 1974.

[8] A. Birafane, M. El-Asmar et al., "Analyzing LINC Systems", Microwave Magazine, IEEE, vol. 11, no. 5, pp. 59-71, August 2010.

[9] R. Dinis and A. Gusmão, "Nonlinear signal processing schemes for OFDM modulations within conventional or LINC transmitter structures", European Transactions on Telecommunications, vol. 19, no. 3, pp. 257-271, April 2008.

[10] T. W. Barton and D. J. Perreault, "Theory and Implementation of RF-Input Outphasing Power Amplification", IEEE Transactions on Microwave Theory and Techniques, vol. 63, no. 12, pp. 4273-4283, December 2015.

[11] D. Cox, "Linear amplification with nonlinear devices", U.S. Pat. No. 3,777,275 A, December 1973.

[12] D. Cox Donald Clyde, R. E Langseth, O. J. D Reudink, A. J. Rustako Jr, "Linear amplification using nonlinear devices and inverse sine phase modulation", U.S. Pat. No. 3,927,379 A, December 1975.

[13] Sangjin Byun, Kwanwoo Kim, Kyutae Lim, Chang-Ho Lee, Haksun Kim, Joy Laskar, "Digital linear amplification with nonlinear components (LINC) transmitter", U.S. Pat. No. 7,889,811 b2, Feb. 15, 2011.

[14] Benny Blumer, "Linear amplification with non-linear components (LINC) modulator and method for generating out-phased signals for a LINC transmitter", U.S. Pat. No. 7,260,368 b1, Aug. 21, 2007.

[15] David J. Perreault, Alexander S. Jurkov, "Radio-frequency (RF) amplifier circuits and related techniques", U.S. Pat. No. 8,451,053 B2, May 28, 2013.

[16] A. S. Simões, P. Bento, M. Gomes, R. Dinis and V. Silva, "Efficient LINC amplification for 5G through ring-type magnitude modulation", Proc IEEE Globecom 2015 Workshop on Mobile Communications in Higher Frequency Bands (MCHFB), San Diego, United States, December 2015.

[17] Herbert J. Wolkstein, "Parallel amplifiers with combining phase controlled from combiner difference port", U.S. Pat. No. 5,222,246, Jun. 22, 1993.

[18] James Stuart Wight, "Chireix architecture using low impedance amplifiers", U.S. Pat. No. 6,836,183 B2, December 2004.

[19] David F. Sorrells, Gregory S. Rawlins, Michael W. Rawlins, "Systems and methods for vector power amplification", U.S. Pat. No. 7,184,723 b2, Feb. 27, 2007.

[20] Frank Winter, Thompson Ian Robinson, Walter De More, "Polar and linear amplifier system", U.S. Pat. No. 6,987,417 B2, Jan. 17, 2006.

[21] L. Kahn, "Single-Sided Transmission by Envelope Elimination and Restoration", Proc. IRE, July 1952, pp. 803-806.

[22] M. Koch, R. Fisher, "A High-Frequency 835 MHz Linear Power Amplifier for Digital Cellular Telephony", 39th IEEE Vehicular Technology Conference, 3 May 1989.

[23] P. Montezuma, R. Dinis and D. Marques, "Robust Frequency-Domain Receivers for A Transmission Technique with Directivity at the Constellation Level", IEEE VTC'2014 (Fall), Vancouver, Canada, September 2014.

[24] V. Astucia, "Linear amplification with multiple nonlinear devices", Master thesis, Faculty of Science and Technology, New University of Lisbon.

[25] P. Montezuma, et al., "Power efficient coded 16-OQAM schemes over nonlinear transmitters", 34th IEEE Sarnoff Symposium, USA, May 3, 2011.

[26] S. Kusunoki, "Power amplification apparatus, OFDM modulation apparatus, wireless transmission apparatus, and distortion reduction method for power amplification apparatus", Patent No.: 2011/0310990 A1, Dec. 22, 2011.

[27] Y. Shalom, D. Arison and K. Kaufman, "Super-linear multi-carrier power amplifier", U.S. Pat. No. 6,166,601, Dec. 26, 2000.

BRIEF SUMMARY OF THE INVENTION

In one embodiment, a time-varying envelope signal is sampled, quantized and decomposed into several quasi or constant envelope in-phase and quadrature constituent signals that are individually amplified, then combined to form a desired quantized version of the time-varying envelope signal. Amplitude, phase and/or frequency characteristics of one or more of the signals are controlled to provide the desired amplitude, phase, frequency, and/or spectral characteristics of the desired quantized version of the time-varying envelope signal.

In another embodiment, a time-varying envelope signal is decomposed into in-phase and quadrature components which are sampled, quantized and decomposed into several quasi constant or constant envelope constituent signals that are individually amplified and then combined to form a desired quantized version of the time-varying complex envelope signal. Amplitude, phase and/or frequency characteristics of one or more of the signals are controlled to provide the desired amplitude, phase, frequency, and/or spectral characteristics of the desired quantized version of the time-varying envelope signal.

In another embodiment, a time-varying envelope signal is decomposed into in-phase and quadrature components which are sampled, quantized and decomposed into several quasi constant or constant envelope constituent signals, that are individually amplified or not depending on the value of the quantization bit associated to each component, and then combined to form a desired quantized version of the time varying envelope signal. Amplitude, phase and/or frequency characteristics of one or more of the signals are controlled to provide the desired phase, frequency, and/or amplitude characteristics of the desired quantized version of the time-varying envelope signal.

In all embodiments the constituent signals are amplified, and then recombined to construct an amplified quantized version of the original time-varying envelope signal.

Embodiments of the invention can be practiced with modulated single carrier signals, modulated multi-carrier signals.

Embodiments of the invention can be implemented with analog and/or digital controls. The invention can be implemented with analog components or with a combination of analog components and digital components.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure and methods particularly pointed out in the written description and claims hereof as well as the appended drawings.

It is to be understood that both the foregoing summary and the following detailed description are exemplary and explanatory and are intended to provide further explanation of embodiments of the invention as claimed.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE FIGURES

The various aspects of embodiments of the present invention will be described with reference to the accompanying drawings, wherein generally similar reference numbers indicate identical or functionally similar elements. The various aspects of embodiments disclosed here, including features and advantages of the present invention outlined above are described more fully in the detailed description in conjunction with the drawings in which.

DETAILED DESCRIPTION OF THE INVENTION

Table of Contents

Figure 1:
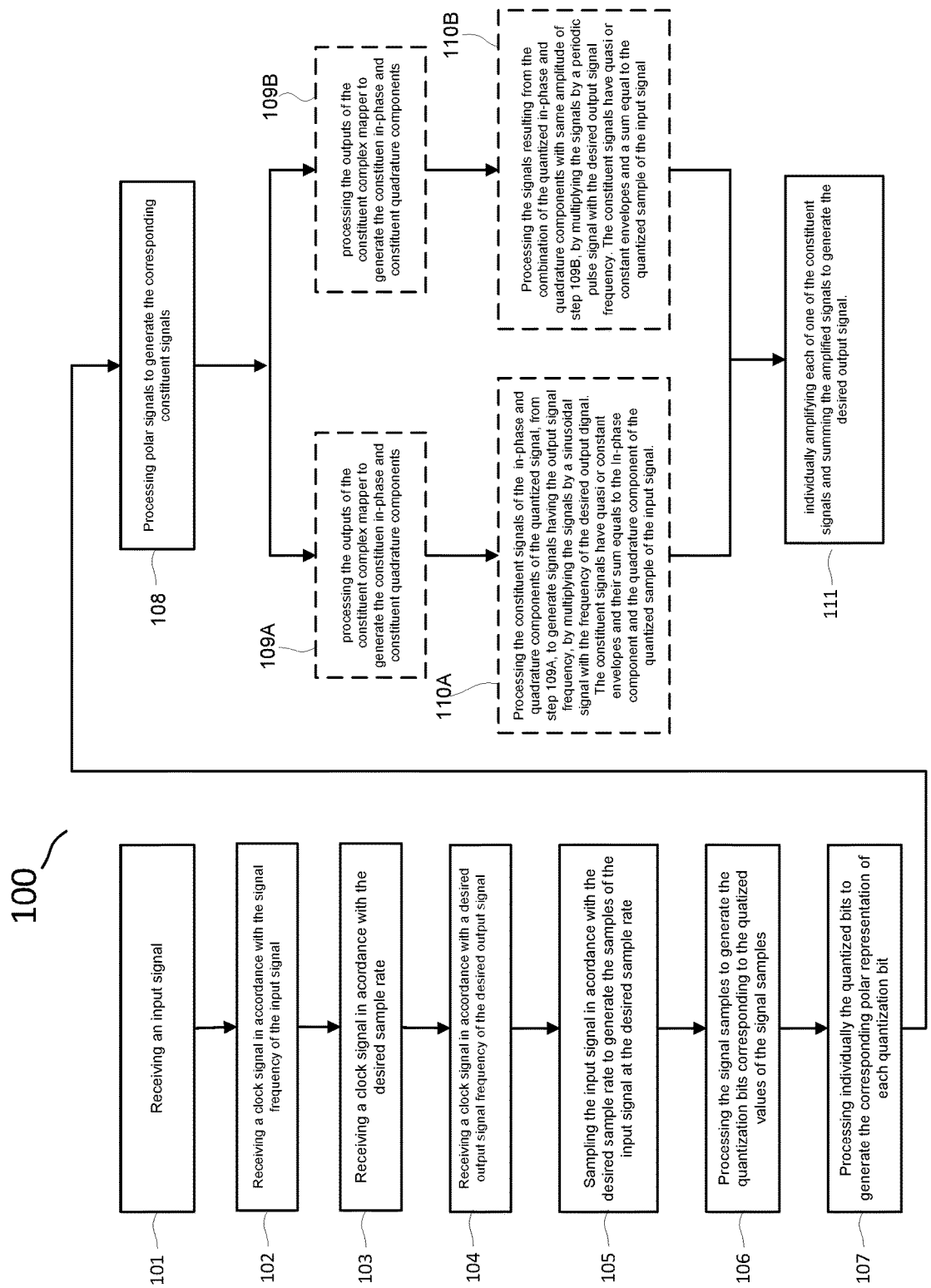
FIG. 1 is a process flowchart embodiment for power amplification according to the analog to analog converter with quantized digital controlled amplification method.

1. Introduction
 1.1. Decomposition of time-varying envelope signals into constant envelope components
2. Analog to analog converter with quantized digital controlled amplification (AAQDCA) methods and systems
 2.1. Analog to analog converter with quantized digital controlled amplification
 2.2. I/Q analog to analog converter with quantized digital controlled amplification
 2.3 On/Off analog to analog converter with quantized digital controlled amplification
3. Multi amplifier amplification stage
 3.1. Multi amplifier amplification stage embodiments
4. Summary
5. Conclusions

1. INTRODUCTION

Methods, apparatuses and systems for analog to analog converter with quantized digital controlled amplification (AAQDCA) are disclosed herein. High-level description of AAQDCA methods and systems according to embodiments of the present invention will be provided in next sections 2 and 3.

The AAQDCA by quantizing and decomposing the quantized envelope signal into constant envelope constituent signals allows the use of non-linear amplifiers in the amplification of time varying envelope signals, avoiding at same time non-linear distortion effects.

For purposes of convenience, and not limitation, methods and systems of the present invention are sometimes referred as quantized digital controlled amplification (QDCA).

Some definitions are provided in this section only for convenience purposes, and are not limiting. The meaning of these terms will be apparent for a person skilled in the art based on the entirety of the teachings provided herein.

Generically, modulated signals can be described by $s(t)=s_I(t)\cos(w_c t)+j\ s_Q(t)\sin(w_c t)$, where $w_c=2\pi f_c$ denotes the angular frequency, $f_c$ denotes the carrier frequency, and $s_I(t)$ and $s_Q(t)$ denote the in-phase and the quadrature component, respectively. The signal can be also described in terms of its complex envelope by $s(t)=\mathrm{Re}\{\tilde{s}(t)e^{jw_c t}\}$, where $\tilde{s}(t)=s_I(t)+js_Q(t)$ denotes the complex envelope, with the signal envelope given by $e(t)=\sqrt{(s_I(t))^2+(s_Q(t))^2}$. When $e(t)$ is constant or quasi constant along time a signal is said as constant envelope signal. Time varying envelope signal refers a signal where $e(t)$ shows amplitude variations with time. Having both non-constant envelope and phase, $s(t)$ is said to be a time-varying complex envelope signal. The dynamic range (DR) of the envelope represents the range of values between which the signal's envelope varies. The dynamic range of the in-phase component (DRi) represents the range of values between which the in-phase component varies. The dynamic range of the quadrature component (DRq) represents the range of values between which the quadrature component varies.

For purposes of convenience, and not limitation, time varying complex envelope signals are sometimes referred to herein as time varying envelope signals.

1.1 Decomposition of Time-Varying Envelope Signals into Constant Envelope Components In a time varying envelope signal the envelope values may assume any value inside the dynamic range of the envelope, which means that the number of possible values for the envelope will be infinite. Without a discretization of the possible magnitude values of the time varying envelope, a phase phasor that represents the signal the outphasing or LINC technique, mentioned before, can be applied to obtain the decomposition into two or more constant magnitude phasors with appropriately specified phase shifts relative to a reference phasor.

A different approach can be applied to decompose time varying envelope signals into quasi constant or constant envelope components based on the discretization of the signal envelope values, which can be performed by a quantization process. Through the quantization the infinite set of envelope values could be restricted to a finite set of quantizer values or symbols $\mathfrak{S} = \{s_0, s_1, \ldots, s_{N_{QL}-1}\}$, where $N_{QL}$ dneotes the number of quantization levels, i.e. the size of the alphabet of quantization symbols. Let $N_{QL}$ denote as $s(nT_s) = s_n$ the time domain sample of the time-varying envelope signal at the sample instant $nT_s$ and $s_I(nT_s) = s_{nI}$ and $s_Q(nT_s) = s_{nQ}$ the corresponding in-phase and quadrature components. Dynamic ranges of $(nT_s) = s_n$, $s_I(nT_s) = s_{nI}$ and $s_Q(nT_s) = s_{nQ}$ are DR, DRi and DRq respectively. For purposes of convenience, and not limitation it is assumed that DRi=DRq.

By the quantization process the time domain sample of the input signal $s_n$ is transformed into a quantized symbol $s_{n,QT}$ taken from a finite alphabet of $N_{QL} = 2^{N_b}$ possible quantization symbols. The $N_b$ quantization bits and $N_{QL} = 2^{N_b}$ quantization levels can be defined in terms of the maximum quantization error $$\varepsilon_Q = \frac{DR}{2 \times 2^{N_b}} = \Delta,$$

where $2\Delta$ represents the quantization interval between two adjacent complex quantization symbols. The $N_b$ quantization $(\beta_n^{(N_b-1)}, \beta_n^{(N_b-2)}, \ldots, \beta_n^{(1)}, \beta_n^{(0)})$ bits are employed in the definition of $N_m \leq N_b$ polar components in which each quantization level can be decomposed. The bits $(\beta_n^{(N_b-1)}, \beta_n^{(N_b-2)}, \ldots, \beta_n^{(1)}, \beta_n^{(0)})$ are converted into polar form $(b_n^{(N_b-1)}, b_n^{(N_b-2)}, \ldots, b_n^{(1)}, b_n^{(0)})$ by $b_n^{(m)} = (-1)^{\beta_n^{(m)}}$. The finite set of quantizer symbols $\mathfrak{S} = \{s_0, s_1, \ldots, s_{N_{QL}-1}\}$, where $N_{QL} = 2^{N_b}$ is the number of quantization levels.

Each symbol from the finite set of quantizer values or symbols $\mathfrak{S} = \{s_0, s_1, \ldots, s_{N_{QL}-1}\}$, can be represented as a sum of $N_m \leq N_b$ polar components, that are the result of the decomposition of quantization value $s_{n,QT}$ into polar components or complex components, which is given by $$s_{n,QT} = g_0 + g_1 b_n^{(0)} + g_2 b_n^{(1)} + g_3 b_n^{(0)} b_n^{(1)} + g_4 b_n^{(2)} + \ldots = \sum_{i=0}^{N_m-1} g_i \prod_{m=0}^{N_m-1} (b_n^{(m)})^{\gamma_{m,i}} = \sum_{i=0}^{N_m-1} g_i b_n^{eq(i)},$$

with $(\gamma_{N_m-1,i} \gamma_{N_m-2,i} \ldots \gamma_{1,i} \gamma_{0,i})$ denoting the binary representation of i, $b_n^{(m)} = (-1)^{\beta_n^{(m)}}$ denoting the polar representation of the bit $\beta_n^{(m)}$, $b_n^{eq(i)} = \prod_{m=0}^{N_m-1} (b_n^{(m)})^{\gamma_{m,i}}$ denoting the i'th polar compoennts of $s_n$ and $N_m$ is the number of non-null complex coefficients $g_i$ of the referred decomposition equation above (the total number of coefficients is $2^{N_b}-1$). For example, for $N_b=6$ and a symmetrical dynamic range DR (using as reference the zero value) the quantization levels are $$\pm p \frac{\sqrt{2}}{2} \Delta \pm jk \frac{\sqrt{2}}{2} \Delta,$$

with p=1, 3, 5, 7 and k=1, 2, 3 5 7 which can be given by $$s_{n,QT} = g_1 b_n^{(0)} + g_2 b_n^{(1)} + g_4 b_n^{(2)} + g_8 b_n^{(3)} + g_{16} g_n^{(4)} + g_{32} b_n^{(5)},$$

with $$g1 = \frac{\sqrt{2}}{2}\Delta, g2 = j\frac{\sqrt{2}}{2}\Delta, g4 = 2\frac{\sqrt{2}}{2}\Delta, g8 = j2\frac{\sqrt{2}}{2}\Delta,$$

$$g16 = 4\frac{\sqrt{2}}{2}\Delta, g32 = j4\frac{\sqrt{2}}{2}\Delta \text{ and } g_i = 0, \text{ for } \forall i \neq 1, 2, 4, 8, 16, 32.$$

The example above refers the case of quantized samples taken from time variant envelope signals. A person skilled in the art, however, will understand that by quantizing the envelope values of any time-variant envelope signal, and decomposing as a sum of a plurality of quasi or constant envelope signals, any time-variant quantized version of the envelope signal can be generated in terms of constant envelope signals.

2. ANALOG TO ANALOG CONVERTER WITH QUANTIZED CONTROLLED AMPLIFICATION METHODS AND SYSTEMS

AAQDCA methods and systems according to embodiments of the present invention rely on the ability to quantize and decompose any quantized time-varying envelope signal into several substantially constant envelope constituent signals or to generate such constituent signals, amplify the constituent signals, and then sum the amplified signals to generate an amplified version of the time-varying envelope signal. In sections 2.1-2.3, embodiments of the present invention are provided, including 6 amplification branch embodiments with all branches active or controlled branch activation depending on the polarity of the quantized signal. In the following descriptions, each embodiment is first presented conceptually using a mathematical derivation of underlying concepts of the embodiment. Three embodiments of a method of operation of the QDCA are then presented, followed by various system level embodiments. In the next embodiments for purposes of convenience, and not limitation it is assumed that DRi=DRq.

2.1 Analog to Analog Converter with Quantized Digital Controlled Amplification According to one embodiment of the invention, herein called QDCA for ease of illustration and not limitation, a time varying envelope signal is decomposed into 6 quasi or constant envelope constituent signals and DRi=DRq. The constituent signals are amplified individually, and then summed to construct an amplified version of the original time-varying complex envelope signal.

According to another embodiment of the invention, herein called quantized digital controlled amplification with complex components (QDCAC) for ease of illustration and not limitation, a time varying envelope signal is decomposed into 6 quasi or constant envelope constituent signals and DRi=DRq. The in-phase and quadrature constituent signals with same amplitude are summed to generate 3 complex constituent signals that are amplified individually, and then summed to construct an amplified version of the original time-varying complex envelope signal.

It is noted that 6 or 3 branches are employed in these embodiments, it is also assumed DRi=DRq and the same number of quantization bits for in-phase and quadrature components for purposes of illustration, and not limitation. The scope of the invention covers the use of other numbers of branches, DRi≠DRq and different number of quantization bits for the in-phase and quadrature components and implementation of such variations will be apparent to persons skilled in the art based on the teachings contained herein.

Accordingly, in the QDCA and QDCAC embodiments the time domain sample of the signal $s_n$ is transformed into a quantized symbol $s_{n,QT}$ taken from a finite alphabet of $2^{N_b}$ complex quantization symbols. The $N_b$ quantization bits and $N_{QL}=2^{N_b}$ quantization levels can be defined in terms of the maximum quantization error $$\varepsilon_Q = \frac{DR}{2 \times 2^{N_b}} = \Delta,$$

where $2\Delta$ represents the quantization interval. The $N_b$ quantization $(\beta_n^{(N_b-1)}, \beta_n^{(N_b-2)}, \ldots, \beta_n^{(1)}, \beta_n^{(0)})$ bits are employed in the definition of $N_m \leq N_b$ complex components in which each quantization level can be decomposed. The bits $(\beta_n^{(N_b-1)}, \beta_n^{(N_b-2)}, \ldots, \beta_n^{(1)}, \beta_n^{(0)})$ are converted into polar form $(b_n^{N_b-1}, b_n^{(N_b-2)}, \ldots, b_n^{(1)}, b_n^{(0)})$ by $b_n^{(m)}=(-1)^{\beta_n^{(m)}}$. The finite set of quantizer symbols $\mathfrak{S} = \{s_0, s_1, \ldots, s_{N_{QL}-1}\}$, where $N_{QL}=2^{N_b}$ is the number of complex quantization levels. Each symbol from the finite set of quantizer complex alphabet $\mathfrak{S} = \{s_0, s_1, \ldots, s_{N_{QL}-1}\}$, can be represented as a sum of $N_m \leq N_b$ components, that are the result of the decomposition of quantization value $s_{n,QT}$ given by $$s_{n,QT} = g_0 + g_1 b_n^{(0)} + g_2 b_n^{(1)} + g_3 b_n^{(0)} b_n^{(1)} + g_4 b_n^{(2)} + \cdots$$

$$= \sum_{i=0}^{N_m-1} g_i \prod_{m=0}^{N_m-1} (b_n^{(m)})^{\gamma_{m,i}} = \sum_{i=0}^{N_m-1} g_i b_n^{eq(i)},$$

with $(\gamma_{N_m-1,i}, \gamma_{N_m-2,i}, \ldots, \gamma_{1,i}, \gamma_{0,i})$ denoting the binary representation of i, $b_n^{(m)}=(-1)^{\beta_n^{(m)}}$ denoting the polar representation of the bit $\beta_n^{(m)}$, $b_n^{eq(i)}=\prod_{m=0}^{N_m-1}(b_n^{(m)})^{\gamma_{m,i}}$ denoting the i-th component of $s_n$ and $N_m$ is the number of non-zero $g_i$ complex coefficients of the referred decomposition equation (the total number of coefficients is $2^{N_b}-1$). For example, for $N_b=6$ and a symmetrical DR (using as reference the zero value) the quantization levels are $$\pm p \frac{\sqrt{2}}{2} \Delta \pm jk \frac{\sqrt{2}}{2} \Delta,$$

with p=1, 3, 5, 7 and k=1, 3, 5, 7, which can be given by $$s_{n,QT} = g_1 b_n^{(0)} + g_2 b_n^{(1)} + g_4 b_n^{(2)} + g_8 b_n^{(3)} + g_{16} b_n^{(4)} + g_{32} b_n^{(5)} = s_{1,2} + s_{4,8} + s_{16,32}$$

with $$g1 = \frac{\sqrt{2}}{2}\Delta, g8 = j\frac{\sqrt{2}}{2}\Delta, g2 = 2\frac{\sqrt{2}}{2}\Delta,$$

$$g16 = j2\frac{\sqrt{2}}{2}\Delta, g4 = 4\frac{\sqrt{2}}{2}\Delta, g32 = j4\frac{\sqrt{2}}{2}\Delta$$

and all the others gi zero valued and $$s_{1,2} = \pm\frac{\sqrt{2}}{2}\Delta \pm j\frac{\sqrt{2}}{2}\Delta, s_{4,8} = \pm\frac{2\sqrt{2}}{2}\Delta \pm j\frac{2\sqrt{2}}{2}\Delta,$$

$$s_{16,32} = \pm\frac{4\sqrt{2}}{2}\Delta \pm j\frac{4\sqrt{2}}{2}\Delta.$$

Each one of the $N_m$ polar components with amplitude $g_i$ can be modulated as a bi-phase shift keying (BPSK) signal. Note that the pulse shape employed in each BPSK signal can be selected to achieve high spectral efficiency and constant envelope. For the i-th branch the peak amplitude of the corresponding BPSK signal is given by the corresponding $|g_i|$. In the QDCA embodiment the in-phase and quadrature components are used to generate constituent signals with constant envelope that are individually amplified. In the QDCAC embodiment the in-phase and quadrature components whit same amplitude can be also combined to generate constituent signals with constant envelope that are individually amplified.

The operation of the QDCA and QDCAC embodiments shall be described further with reference to the flowchart of FIG. 1. Optional components are illustrated with dashed lines. The process starts at step 101, which includes receiving the signal to be amplified. In another embodiment this involves receiving the desired input RF signal. In another embodiment this involves receiving the desired intermediate frequency (IF) signal. In another embodiment this involves receiving the envelope samples of the desired input signal.

Step 102 includes receiving a clock signal set according to the signal frequency of the input signal.

Step 103 includes receiving a clock signal set according to a desired sample rate of the input signal. It is important to mention that as understood by a person skilled in the art the sample rate may vary according to the bandwidth of the input signal and the desired time resolution of the sampling process.

Step 104 includes receiving a clock signal in accordance with a desired output signal frequency of the desired output signal.

Step 105 includes sampling the input signal in accordance with the sampling rate to generate the samples of the input signal. In the embodiment example of FIG. 2, step 105 is implemented by a sampling circuit or a sample and hold (S/H) circuit.

Step 106 includes quantizing the samples to generate the quantization bits that correspond to the quantized symbol.

Step 107 includes processing individually the quantized bits to generate the corresponding polar representation of each quantization bit.

Step 108 includes processing the six polar signals to generate the corresponding constituent signals. It is important to note that in certain embodiments of the present invention steps 106, 107 and 108 can be done once by a block that quantizes and converts directly the samples into the constituent constant envelope signals. As understood by a person skilled in the art based on the teaching herein, the steps 106 to 108 can be performed by a block using a comparator and a LUT with the corresponding constituent signals for the quantized values.

Step 109A includes processing the outputs of the constituent complex mapper to generate the in-phase and quadrature components of each quantized sample.

Step 109B includes processing the in-phase and quadrature components of the quantized sample by summing in-phase and quadrature components with same amplitude to generate a set of constituent signals with quasi or constant envelope and a sum equal to the quantized sample of the signal.

Step 110A includes processing the quantized in-phase components of the constituent signals by multiplying the signals by a periodic pulse signal with the desired output signal frequency. The quantized in-phase constituent signals have quasi or constant envelopes and a sum equal to the in-phase component of the quantized sample of the input signal. Includes processing the quantized quadrature components of the constituent signals by multiplying the signals by a periodic pulse signal with the desired output signal frequency. The quantized quadrature constituent signals have quasi or constant envelopes and a sum equal to the quadrature component of the quantized sample of the input signal.

Step 110B includes processing the signals resulting from the combination of the quantized in-phase and quadrature components with same amplitude of step 109B, by multiplying the signals by a periodic pulse signal with the desired output signal frequency. The constituent signals have quasi or constant envelopes and a sum equal to the quantized sample of the input signal.

Step 111 includes individually amplifying each of one of the constituent signals, and summing the amplified signals to generate the desired output signal.

Figure 2A:
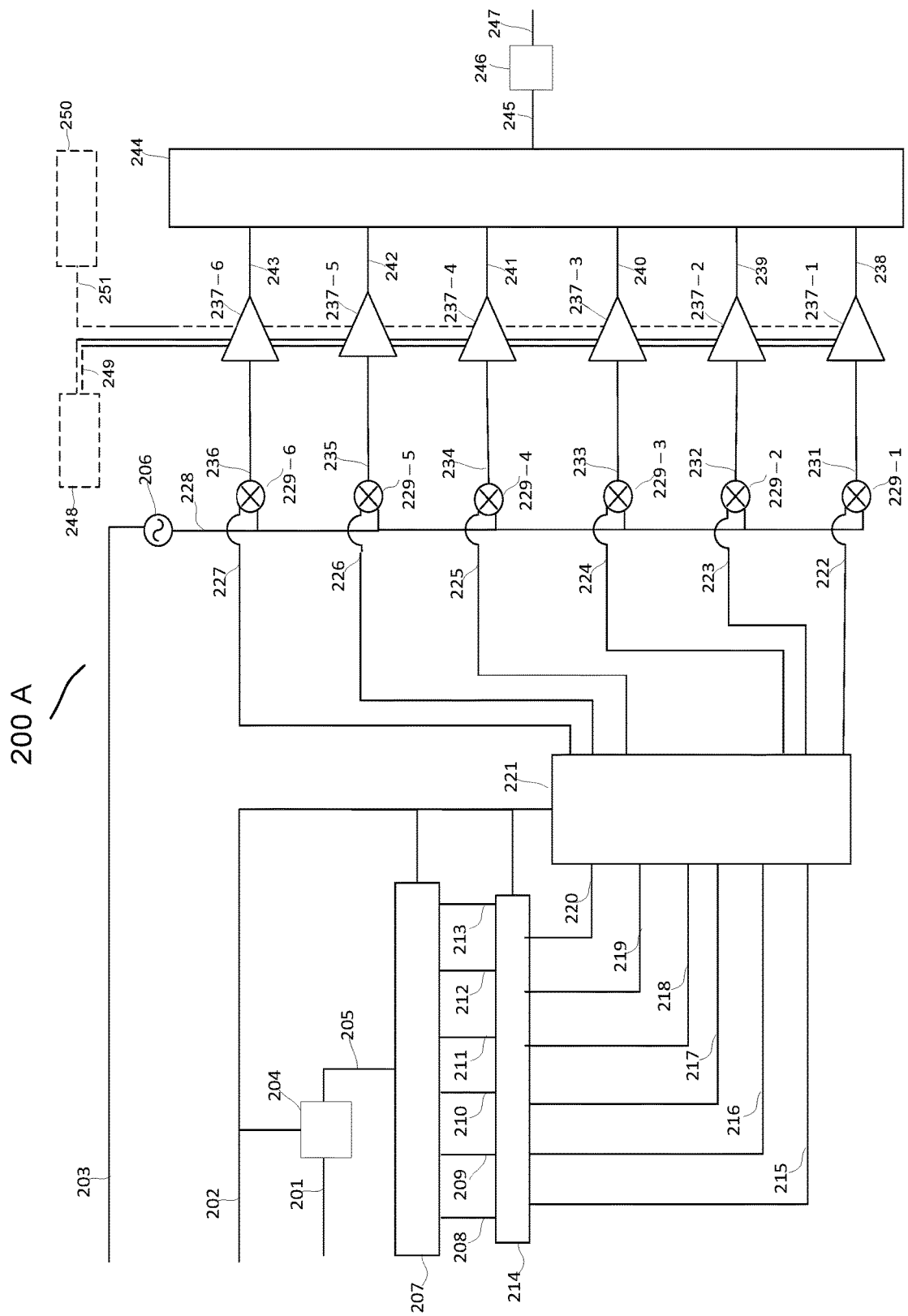
FIG. 2A is a block diagram that illustrates an exemplary embodiment of a signal power amplification apparatus for implementing the analog to analog converter with quantized digital controlled amplification method.

Block diagram 200A of FIG. 2A is an example that illustrates an exemplary embodiment of the QDCA embodiment implementing the process flowchart 100 of FIG. 1, but using the optional steps 109A and 110A. In the example of FIG. 2A, optional components are illustrated with dashed lines. In other embodiments, additional components may be optional. In this example a bandpass time varying envelope signal 201, a clock reference signal 202 for the sampling process and a channel clock 203, with the desired frequency for the output signal, are received as inputs. In another embodiment the signal 201 can be the samples of a time-varying envelope signal and the S/H 204 is not required. In another embodiments signal 201 can be a baseband signal, or IF signal.

The clock reference signal 202 can be used by the S/H block 204, by the quantizer 207 and by the polar converter block 214. It can be understood by a person skilled in the art that the choice of the clock reference signal is made according the bandwidth of the input signal and the desired output signal.

The S/H circuit 204 samples the received signal according to a clock signal 202 and releases these values 205 to the quantizer 206. Still referring to FIG. 2, the samples 205 are converted by the 6 bit quantizer 207 into 6 bits signals 208, 209, 210, 211, 212, and 213. The signals 208, 209, 210, 211, 212, and 213 are provided to a polar converter 214 that generates the signals 215, 216, 217, 218, 219 and 220 that are the polar versions of the bits signals 208, 209, 210, 211, 212, and 213. It is noted that one 6 bit quantizer and 6 amplification branches are employed in this embodiment only for purposes of illustration, and not limitation. The scope of the invention covers use of other numbers of branches, and implementation of such variations will be apparent to persons skilled in the art based on the teachings contained herein.

The polar signals 215, 216, 217, 218, 219 and 220 are provided to the constituent signal mapper 221 that generates the in-phase constituent signals components 222, 223 and 224 that correspond to the real part of the complex symbol signals $s_{1,2}$, $s_{4,8}$, $s_{16,32}$ and generates the quadrature constituent signals components 225, 226 and 227 that correspond to imaginary part of the complex symbol signals $s_{1,2}$, $s_{4,8}$, $s_{16,32}$, respectively. The signal mapper also generates for each constituent signal component a pulse shape to assure good spectral efficiency and power efficiency.

In an embodiment a common clock signal 202 is used to ensure that the outputs of S/H 205, the outputs of quantizer 207 and the outputs of the polar converter 214 are time aligned.

In-phase constituent signals 231, 232 and 233 are obtained by multiplying in 229-1, 229-2 and 229-3 the signals 222, 223 and 224 by a pulse periodic signal 228 with the desired frequency for the output signal generated by 206. Quadrature constituent components signals 234, 235 and 236 are obtained by multiplying in 229-4, 229-5 and 229-6 the signals 225, 226 and 227 by a pulse periodic signal 228 with the desired frequency for the output signal generated by 206. Constituent signals 231, 232, 233, 234, 235 and 236 with quasi or constant envelope are the inputs of the corresponding power amplifiers (PAs) 237-{1, . . . , 6} of the amplification stage that may be non-linear power amplifiers. In another embodiment PAs 237-{1, . . . , 6} include switching power amplifiers of class D. In another embodiment PAs 237-{1, . . . , 6} include switching power amplifiers of class E, class F and sigma delta class S.

The outputs of PAs 238, 239, 240, 241, 242 and 243 are coupled together in a combiner 244 using well known combining techniques such as active combiners or other techniques such as Wilkison, hybrid or transformers. Alternatively, the outputs of PAs 237-{1, . . . , 6} can be coupled through LC matching for a minimal power loss. Amplification stage embodiments according to power amplification methods and systems of the present invention will further described in section 3.1.

The combiner's output signal 245 is submitted to a bandpass filter 246 with central frequency equal to the desired frequency of the output signal 247.

In another embodiment a bias circuit 249 can be employed to provide bias signals 249-{1, . . . , 6} to the PAs. In another embodiment a phase control circuit 250 could be employed to generate control signals 251-{1, . . . , 6} to compensate any phase shifts among amplifiers.

Figure 2B:
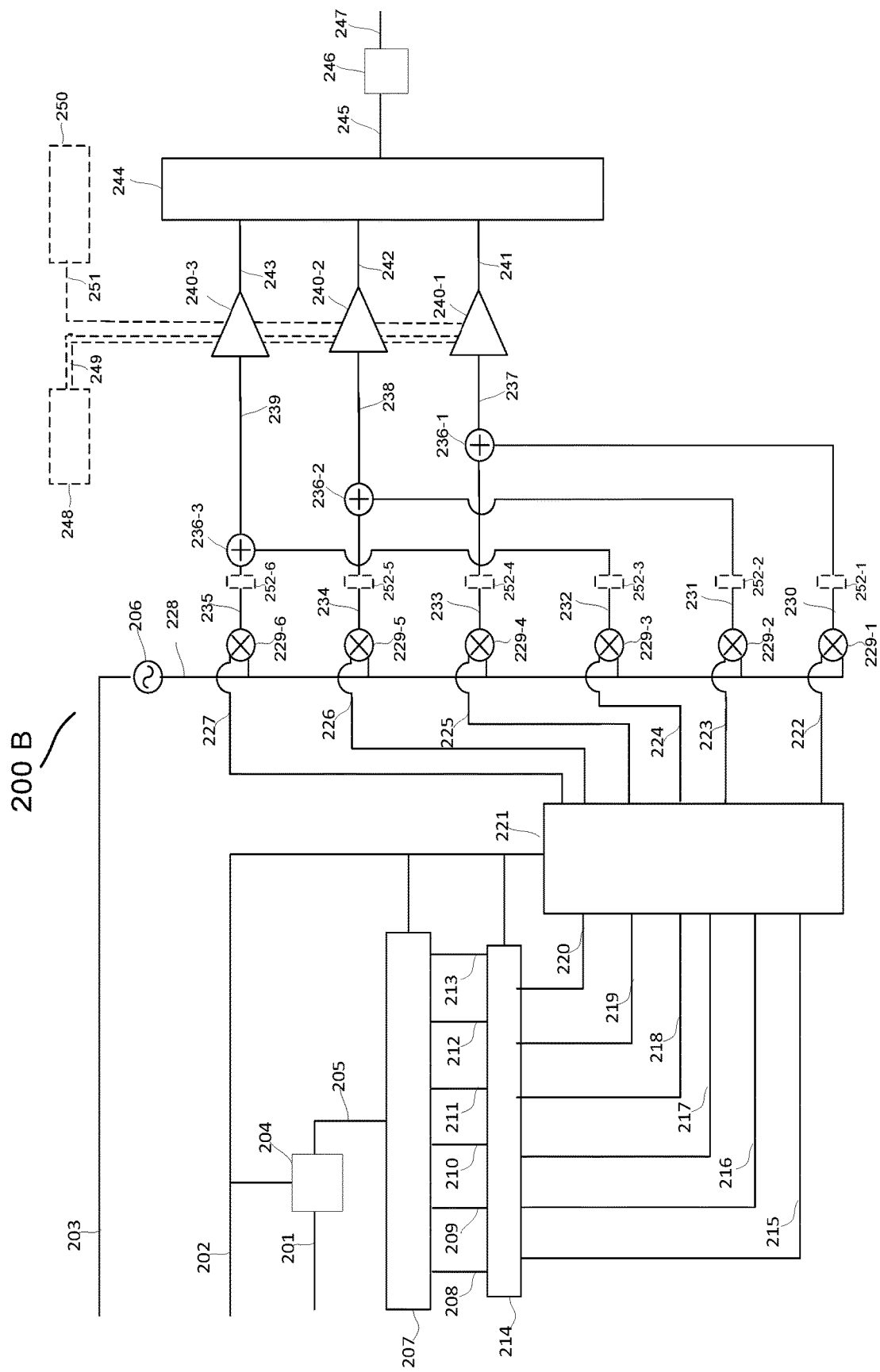
FIG. 2B is a block diagram that illustrates an exemplary embodiment of a signal power amplification apparatus for implementing the analog to analog converter with quantized digital controlled amplification method with constituent signals resulting from the sum of in-phase and quadrature constituent components of the quantized sample of the input signal

Block diagram 200B of FIG. 2B is an example that illustrates an embodiment of the QDCAC implementing the process flowchart 100 of FIG. 1 and using the optional steps 109B and 110B. In the example of FIG. 2B, optional components are illustrated with dashed lines. In other embodiments, additional components may be optional.

In this example a bandpass time varying envelope signal 201, a clock reference signal 202 for the sampling process and a channel clock 203 with the desired frequency for the output signal are received as inputs. In another embodiment the signal 201 can be the samples of a time-varying envelope signal and the S/H 204 is not required. In another embodiments signal 201 can be a baseband signal, or IF signal.

The clock reference signal 202 can be used by the S/H block 204, by the quantizer 207 and by the polar converter block 214. It can be understood by a person skilled in the art that the choice of the clock reference signal is made according the bandwidth of the input signal and the desired output signal.

The S/H circuit 204 samples the received signal according to a clock signal 202 and releases these values 205 to the quantizer 206. Still referring to FIG. 2, the samples 205 are converted by the 6 bit quantizer 207 into 6 bits signals 208, 209, 210, 211, 212, and 213. The signals 208, 209, 210, 211, 212, and 213 are provided to a polar converter 214 that generates the signals 215, 216, 217, 218, 219 and 220 that are the polar versions of the bits signals 208, 209, 210, 211, 212, and 213. It is noted that one 6 bit quantizer and 3 amplification branches are employed in this embodiment only for purposes of illustration, and not limitation. The scope of the invention covers use of other numbers of branches, and implementation of such variations will be apparent to persons skilled in the art based on the teachings contained herein.

The polar signals 215, 216, 217, 218, 219 and 220 are provided to the constituent signal mapper 221 that generates the in-phase constituent signals components 222, 223 and 224 that correspond to the real part of the complex symbol signals $s_{1,2}$, $s_{4,8}$, $s_{16,32}$ and generates the quadrature constituent signals components 225, 226 and 227 that correspond to imaginary part of the complex symbol signals $s_{1,2}$, $s_{4,8}$, $s_{16,32}$, respectively. The signal mapper also generates for each constituent signal a pulse shape to assure good spectral efficiency and power efficiency.

In an embodiment a common clock signal 202 is used to ensure that the outputs of S/H 205, the outputs of quantizer 207 and the outputs of the polar converter 214 are time aligned.

The in-phase constituent signals 230, 231 and 232 are obtained by multiplying in 229-1, 229-2 and 229-3 the signals 222, 223 and 224 by a pulse periodic signal 228 with the desired frequency for the output signal generated by 206. The quadrature constituent signals 233, 234 and 235 are obtained by multiplying in 229-4, 229-5 and 229-6 the signals 225, 226 and 227 by a pulse periodic signal 228 with the desired frequency for the output signal generated by 206.

In-phase constituent signals 230, 231 and 232 are summed in 236-1, 236-2 and 236-3 with the quadrature constituent signals 233, 234 and 235 with the same amplitude, i. e. each in-phase component is combined with the corresponding quadrature component with the same amplitude to generate the constituent complex signals 237, 238 and 239. Constituent signals 237, 238 and 239 have quasi or constant envelope and are the inputs of the corresponding power amplifiers (PAs) 240-{1, . . . , 3} of the amplification stage that may be non-linear power amplifiers. In another embodiment PAs 240-{1, . . . , 3} include switching power amplifiers of class D. In another embodiment PAs 240-{1, . . . , 3} include switching power amplifiers of class E, class F and sigma delta class S.

The outputs of PAs 241, 242 and 243 are coupled together in a combiner 244 using well known combining techniques such as active combiners or other techniques such as Wilkison, hybrid or transformers. Alternatively, the outputs of PAs 241, 242 and 243 can be coupled through LC matching for a minimal power loss. Amplification stage embodiments according to power amplification methods and systems of the present invention will further described in section 3.1.

The output signal 245 is submitted to a bandpass filter 246 with central frequency equal to the desired frequency of the output signal 247.

In another embodiment a bias circuit 248 can be employed to provide bias signals 249-{1, . . . , 3} to the PAs. In another embodiment a phase control circuit 250 could be employed to generate control signals 251-{1, . . . , 3} to compensate any phase shifts among amplifiers.

In other embodiment voltage-to-current or current-to-voltage converters 252-{1, . . . , 6} may be employed before the sum of the in-phase and quadrature constituent signals with same amplitude performed in 236-{1, . . . , 3}. It is important to mention that as understood by a person skilled in the art that the voltage-to-current or current-to-voltage converters 252-{1, . . . , 6} may be embedded in the sum operations 236-{1, . . . , 3} or in the multiplications performed in 229-{1, . . . , 6}.

2.2 I/Q Quantized Digital Controlled Amplification (IQQDCA)

According to one embodiment of the invention, herein called the I/Q quantized Digital controlled amplification (IQQDCA), for ease of illustration and not limitation, a time-varying envelope signal is decomposed into 6quasi or constant envelope constituent signals and DRi=DRq. The constituent signals are amplified individually, and then summed to construct an amplified version of the original time-varying complex envelope signal. It is noted that 6 amplification branches are employed in these embodiments for purposes of illustration, and not limitation. The scope of the invention covers use of other numbers of branches, and DRi=DRq and DRi≠DRq and implementation of such variations will be apparent to persons skilled in the art based on the teachings contained herein.

According to another embodiment of the invention, herein called the IQQDCA with complex components (IQQDCAC), for ease of illustration and not limitation, a time-varying envelope signal is decomposed into 3 quasi or constant envelope complex constituent signals and DRi=DRq. The constituent signals are amplified individually, and then summed to construct an amplified version of the original time-varying complex envelope signal. It is noted that 3 amplification branches are employed in these embodiments for purposes of illustration, and not limitation. The scope of the invention covers use of other numbers of branches, and DRi=DRq and DRi≠DRq and implementation of such variations will be apparent to persons skilled in the art based on the teachings contained herein.

According to IQQDCA and IQQDCA embodiments the time domain sample of the complex envelope in-phase component $s_{nI}$ can be transformed into a quantized symbol $s_{nI,QT}$ taken from a finite alphabet of $2^{N_b}$ possible quantization symbols. Also, time domain sample of the complex envelope quadrature component $s_{nQ}$ can be transformed into a quantized symbol $s_{nQ,QT}$ taken from a finite alphabet of $2^{N_b}$ possible quantization symbols. The $N_b$ quantization bits and $N_{QL}=2^{N_b}$ quantization levels applied in each component can be defined in terms of the maximum quantization errors $$\varepsilon_{Qi} = \frac{DRi}{2 \times 2^{N_b}} = \frac{2\Delta i}{2} \text{ and } \varepsilon_{Qq} = \frac{DRq}{2 \times 2^{N_b}} = \frac{2\Delta q}{2}$$

where $2\Delta i$ and $2\Delta q$ represent the quantization interval for the in-phase component and the quantization interval for the quadrature component, respectively. For each component $N_b$ quantization bits $(\beta_{nI}^{(N_b-1)}, \beta_{nI}^{(N_b-2)}, \ldots, \beta_{nI}^{(1)}, \beta_{nI}^{(0)})$ and $(\beta_{nq}^{(N_b-1)}, \beta_{nq}^{(N_b-2)}, \ldots, \beta_{nq}^{(1)}, \beta_{nq}^{(0)})$ are employed in the definition of $N_m \leq N_b$ polar components in which each quantization level can be decomposed. Both sets of bits $(\beta_{nI}^{(N_b-1)}, \beta_{nI}^{(N_b-2)}, \ldots, \beta_{nI}^{(1)}, \beta_{nI}^{(0)})$ and $(\beta_{nq}^{(N_b-1)}, \beta_{nq}^{(N_b-2)}, \ldots, \beta_{nq}^{(1)}, \beta_{nq}^{(0)})$ are converted into polar forms $(b_{nI}^{(N_b-1)}, b_{nI}^{(N_b-2)}, \ldots, b_{nI}^{(1)}, b_{nI}^{(0)})$ by $b_{nI}^{(m)} = (-1)^{\beta_{nI}(m)}$ and $b_{nq}^{(m)} = (-1)^{\beta_{nq}(m)}$.

Each in-phase symbol from the finite set of quantizer symbols $\mathfrak{S} = \{s_{I,0}, s_{I,1}, \ldots, s_{I,N_{QL}-1}\}$, can be represented as a sum of $N_{mI} \leq N_b$ polar components that are the result of the decomposition of quantization value $s_{nI,QT}$ into polar components given by $$s_{nI,QT} = g_0 + g_1 b_{nI}^{(0)} + g_2 b_{nI}^{(1)} + g_3 b_{nI}^{(0)} b_{nI}^{(1)} + g_4 b_{nI}^{(2)} + \cdots$$

$$= \sum_{i=0}^{N_{mI}-1} g_i \prod_{m=0}^{N_{mI}-1} (b_{nI}^{(m)})^{\gamma_{m,i}} = \sum_{i=0}^{N_{mI}-1} g_i b_{nI}^{eq(i)},$$

with $(\gamma_{N_{mI}-1,i}\ \gamma_{N_{mI}-2,i}\ \cdots\ \gamma_{1,i}\ \gamma_{0,i})$ denosting the binary representation of i, $b_{nI}^{eq(i)} = \prod_{m=0}^{N_{mI}-1} (b_{nI}^{(m)})^{\gamma_{m,i}}$ denoting the i'th polar component of $s_{nI,QT}$ and $N_{mI}$ is the number of non-null $g_i$ real coefficients of the referred decomposition (the total number of coefficients is $2^{N_b}-1$). For example, for $N_b=3$ and a symmetrical dynamic range DRi (using as reference the zero value) the quantization levels are $\pm 7\Delta$, $\pm 5\Delta$, $\pm 3\Delta$, $\pm \Delta$, which can be given by $$s_{nI,QT} = g_1 b_{nI}^{(0)} + g_2 b_{nI}^{(1)} + g_4 b_{nI}^{(2)} = s_{1I} + s_{2I} + s_{4I},$$

with $g1=\Delta$, $g2=2\Delta$, $g4=4\Delta$ and $g0=g3=g5=g6=g7=0$ and $$s_{1I} = \pm \frac{\sqrt{2}}{2}\Delta,\ s_{2I} = \pm \frac{2\sqrt{2}}{2}\Delta,\ s_{4I} = \pm \frac{4\sqrt{2}}{2}\Delta.$$

For the quadrature component each quadrature symbol from the finite set of quantizer symbols $Q = \{s_{q,0}, s_{q,1}, \ldots, q_{q,N_{QL}-1}\}$, can be represented as a sum of $N_{mQ} \leq N_b$ solar components, that are the result of the decomposition of quantization value $s_{nq,QT}$ into polar components given by $$s_{nq,QT} = g_0 + g_1 b_{nq}^{(0)} + g_2 b_{nq}^{(1)} + g_3 b_{nq}^{(0)} b_{nq}^{(1)} + g_4 b_{nq}^{(2)} + \cdots$$

$$= \sum_{i=0}^{N_{mQ}-1} g_i \prod_{m=0}^{N_{mQ}-1} (b_{nq}^{(m)})^{\gamma_{m,i}} = \sum_{i=0}^{N_{mQ}-1} g_i b_{nq}^{eq(i)},$$

with $(\gamma_{N_{mQ}-1,i}\ \gamma_{N_{mQ}-2,i}\ \cdots\ \gamma_{1,i}\ \gamma_{0,i})$ denoting the binary representation of i, $b_{nq}^{eq(i)} = \prod_{m=0}^{N_{mQ}-1} (b_{nq}^{(m)})^{\gamma_{m,i}}$ denoting the i-th polar component of $s_{nQ,QT}$ and $N_{mQ}$ is the number of non-zero $g_i$ imaginary coefficients of the referred decomposition (the total number of coefficients is $2^{N_b}-1$). For example, for $N_b=3$ and a symmetrical dynamic range (using as reference the zero value) the quantization levels are $\pm j7\Delta$, $\pm j5\Delta$, $\pm j3\Delta$, $\pm j\Delta$, which can be given by $$s_{nq,QT} = g_1 b_{nq}^{(0)} + g_2 b_{nq}^{(1)} + g_4 b_{nq}^{(2)},$$

with $g1=j\Delta$, $g2=j\Delta$, $g4=j4\Delta$ and $g0=g3=g5=g6=g7=0$ and $$s_{1Q} = \pm j\frac{\sqrt{2}}{2}\Delta,\ s_{2Q} = \pm j\frac{2\sqrt{2}}{2}\Delta,\ s_{4Q} = \pm j\frac{4\sqrt{2}}{2}\Delta.$$

For the i-th branch the peak amplitude of the corresponding signal is given by the corresponding $|g_i|$. Each one of the $N_m$ polar components with amplitude $g_i$ can be modulated as a BPSK signal. Note that the pulse shape employed in each BPSK signal can be selected to achieve high spectral efficiency and constant envelope. For the i-th branch the peak amplitude of the corresponding BPSK signal is given by the corresponding $|g_i|$. In the IQQDCA embodiment the in-phase and quadrature components are used to generate constituent signals with quasi constant or constant envelope that are indvidualy amplified. In the IQQDCAC embodiment the in-phase and quadrature components whit same amplitude are combined to generate constituent signals with quasi constant or constant envelope that are indvidualy amplified.

Figure 3:
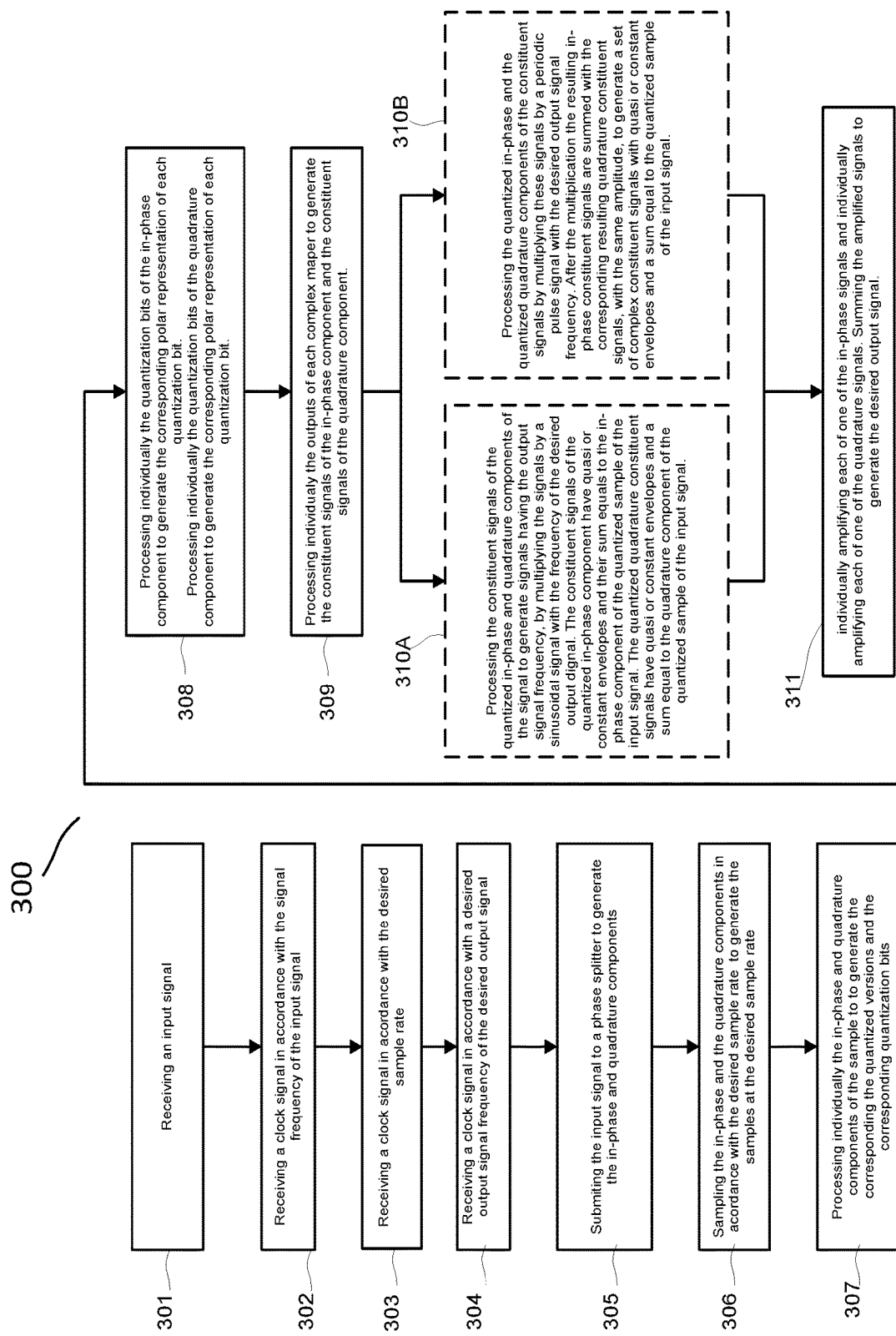
FIG. 3 is a process flowchart embodiment for power amplification according to the I/Q analog to analog converter with quantized Digital controlled amplification method.

Operation of the IQQDCA and IQQDCAC embodiments shall be described further with reference to the flowchart of FIG. 3. Optional steps are illustrated with dashed lines. The process starts at step 301, which includes receiving a time varying envelope bandpass signal. In another embodiment this involves receiving the desired input RF signal. In another embodiment this involves receiving the desired IF signal. In another embodiment this involves receiving a baseband signal. In another embodiment this involves receiving the samples of the time varying envelope signal or receiving the samples the in-phase and quadrature components of a time varying envelope signal.

Step 302 includes receiving a clock signal set according to the signal frequency of the input signal.

Step 303 includes receiving a clock signal set according to a desired sample rate of the input signal. It is important to mention that as understood by a person skilled in the art the sample rate may vary according to the bandwidth of the input signal and the desired time resolution of the sampling process.

Step 304 includes receiving a clock signal in accordance with a desired output signal frequency of the desired output signal.

Step 305 includes processing the signal to generate in-phase and quadrature components.

Step 306 includes sampling the in-phase and quadrature components of the input signal in accordance with the sampling rate to generate the corresponding samples.

Step 307 includes processing individually by a quantizer the in-phase and quadrature components to generate the quantization bits that correspond to the quantized value of the in-phase and the quantization bits that correspond to the quantized value of the quadrature component, respectively. As understood by a person skilled in the art based on the teaching herein, step 307 can be performed by a block using a single quantizer. Also, as understood by a person skilled in the art based on the teaching herein, step 307 can be performed by a comparator and a LUT with the corresponding quantization bits of the quantized values.

Step 308 includes processing individually the quantization bits of the quantized in-phase component to generate the corresponding polar representation of each quantization bit and processing individually the quantization bits of the quantized quadrature component to generate the corresponding polar representation of each quantization bit.

Step 309 includes processing individually in a mapper the polar signals associated to the quantized in-phase component to map them into the corresponding constituent signals and processing individually the polar signals associated to the quantized quadrature component to map them into the corresponding constituent signals. It is important to note that in certain embodiments of the present invention steps 307, 308 and 309 can be done once by a block that quantizes and generates directly the constituent signals.

Step 310A includes processing the quantized in-phase components of the constituent signals by multiplying the signals by a periodic pulse signal with the desired output signal frequency. The quantized in-phase constituent signals have quasi or constant envelopes and a sum equal to the in-phase component of the quantized sample of the input signal. This step also includes also processing the quantized quadrature components of the constituent signals by multiplying the signals by a periodic pulse signal with the desired output signal frequency. The quantized quadrature constituent signals have quasi or constant envelopes and a sum equal to the quadrature component of the quantized sample of the input signal.

Step 310B includes processing the quantized in-phase components and the quantized quadrature components of the constituent signals by multiplying the signals by a periodic pulse signal with the desired output signal frequency. After the multiplication the resulting in-phase constituent signals are summed with the corresponding resulting quadrature constituent components with the same amplitude to generate a set of complex constituent signals with quasi or constant envelopes and a sum equal to the quantized version of the input signal.

Step 311 includes individually amplifying each of one of the constituent signals, and summing the amplified signals to generate the desired output signal.

Figure 4A:
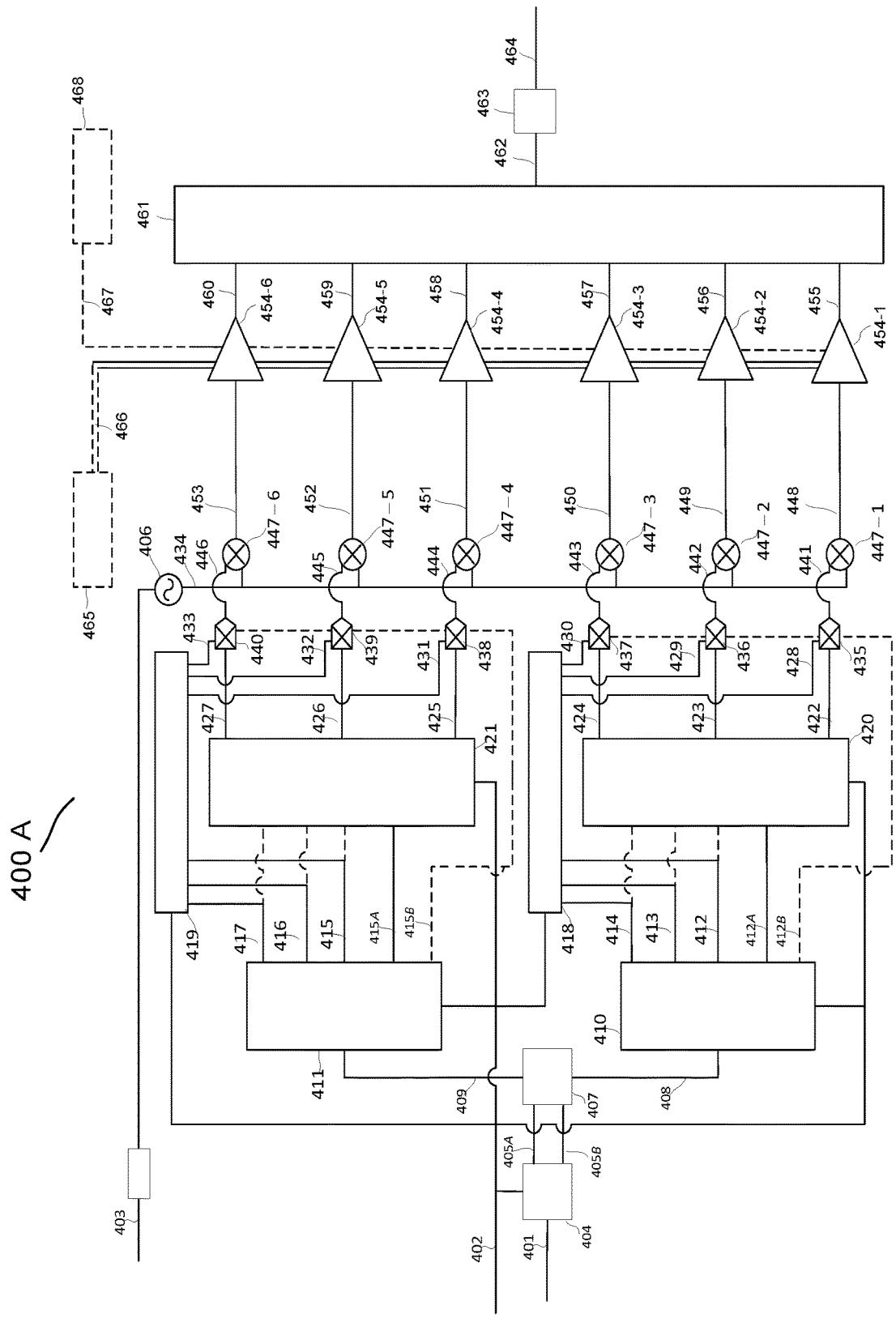
FIG. 4A is a block diagram that illustrates an exemplary embodiment of a signal power amplification apparatus for implementing the I/Q analog to analog converter quantized Digital controlled amplification method with the constituent signals the in-phase and the quadrature components of the quantized sample of the input signal.

Block diagram 400A of FIG. 4A is an example that illustrates an embodiment of the IQQDCA, implementing the process flowchart 300 of FIG. 3, but using optional step 310A. In the example of FIG. 4A, optional components are illustrated with dashed lines. In other embodiments, additional components may be optional.

In this example a time varying envelope signal 401, a clock reference signal 402 for the sampling process and a channel clock 403 with the desired frequency for the output signal are received as inputs. In another embodiment 401 can be the samples of a time-variant envelope signal and the S/H 407 is not required. In another embodiment the input signal 401 can be the samples of the in-phase and quadrature components of a time varying envelope signal and the phase splitter 404 and the S/H are not required.

The clock reference signal 402 can be used by the S/H block 407, by the two quantizers 410 and 411 and by the polar converters 418 and 419. It can be understood by a person skilled in the art that the choice of the clock reference signal is made according the bandwidth of the input signal and the desired output signal. As understood by a person skilled in the art other reference clock signals and different reference clock signals may be used by the different blocks. It is noted that two 3 bit quantizers and 6 amplification branches are employed in this embodiment only for purposes of illustration, and not limitation. The scope of the invention covers the use of other numbers of branches, and implementation of such variations will be apparent to persons skilled in the art based on the teachings contained herein. It is also important to note that in certain embodiments of the present invention the quantizers employed to quantize the values of the samples of the in-phase and quadrature components may have different number of quantization levels and quantization bits.

The input signal 401 is submitted to the phase splitter 404 that generates the in-phase component 405A and quadrature component 405B and releases them to the S/H 407. The S/H circuit 407 samples the in-phase 405A and the quadrature component 405B of the received signal according to a clock signal 402 and generates the in-phase samples 408 and quadrature samples 409. The sample of the in-phase component 408 is submitted to a 3 bit quantizer 410 that generates 3 bit signals 412, 413, and 414, an end of conversion signal 412A to be used as control signal in the constituent signal mapper 420 and a polar signal representing the sign of the sample value 412b. The sample of the quadrature component 409 is submitted to a 3 bit quantizer 410 that generates 3 bit signals 415, 416, and 417, an end of conversion signal 415A to be used as control signal in the constituent signal mapper 421 and a polar signal representing the sign of the sample 415b. Signals 412, 413, 414 and signals 415, 416, and 417 are provided to bit polar converters 418 and 419, that generate the signals 428, 429 and 430 and the signals 431, 432 and 433 that are the polar versions of the signals 412, 413, 414 and signals 415, 416, and 417, respectively. In other embodiment signals 412, 413, 414 and signals 415, 416, and 417 may be provided to the constituent signal mappers.

The signals of the in-phase component 412, 413 and 414 are provided to the in-phase constituent signal mapper 420 that generates the signals 422, 423 and 424 with amplitudes that correspond to the coefficients associated to each bit. Amplitudes of 422, 423 and 424 correspond to the coefficients g1, g2 and g4. The signals 422, 423 and 424 are multiplied by the corresponding polar signals 428, 429, and 430 to generate the in-phase constituent components 441, 442 and 443 that correspond to the signals $s_{1I}$, $s_{2I}$ and $s_{4I}$, associated to the decomposition of the in-phase component of the quantized value. In another embodiment the signals 422, 423 and 424 are multiplied in 435, 436 and 437 by the corresponding polar signals 428, 429, 430 and the polar signal 412b to generate the in-phase constituent components 441, 442 and 443 that correspond to the signals $s_{1I}$, $s_{2I}$ and $s_{4I}$, associated to the decomposition of the in-phase component of the quantized value.

The signals of the quadrature component 415, 416, and 417 are provided to the quadrature constituent signal mapper 421 that generates the signals 425, 426 and 427 with amplitudes that correspond to the coefficients associated to each bit. Amplitudes of 425, 426 and 427 correspond to the coefficients g1, g2 and g4 related with the decomposition of the quadrature value into constituent signals. The signals 425, 426 and 427 are multiplied by the polar signals 431, 432, and 433 to generate the quadrature constituent components 444, 445 and 446 that correspond to the signals $s_{1Q}$, $s_{2Q}$ and $s_{4Q}$, associated to the decomposition of the quadrature component of the quantized value. In another embodiment the signals 425, 426 and 427 are multiplied in 438, 439 and 440 by the polar signals 431, 432, 433 and the polar signal 415b to generate the quadrature constituent components 444, 445 and 446 that correspond to the signals $s_{1Q}$, $s_{2Q}$ and $s_{4Q}$, associated to the decomposition of the quadrature component of the quantized value. Each signal mapper also generates for each constituent signal a pulse shape to assure good spectral efficiency and power efficiency.

In-phase constituent signals 448, 449 and 450 are obtained by multiplying in 447-1, 447-2 and 447-3 the signals 441, 442 and 443 by a periodic pulse signal 434 with the desired frequency for the output signal generated by 406. Quadrature constituent signals 451, 452 and 453 are obtained by multiplying in 447-4, 447-5 and 447-6 the signals 444, 445 and 446 by a periodic pulse signal 434 with the desired frequency for the output signal generated by 406.

In other embodiments the signal 434 can be a sinusoidal signal or a pulse train signal with frequency selected according to the desired frequency of the output signal.

The set of constituent signals 448, 449, 450, 451, 452 and 453 with quasi and/or constant envelope are the inputs of the corresponding PAs 454-{1, . . . , 6} of the amplification stage, that may be non-linear power amplifiers. In another embodiment PAs 454-{1, . . . , 6} include switching power amplifiers of class D. In another embodiment PAs 454-{1, . . . , 6} include switching power amplifiers of class E. In another embodiment PAs 454-{1, . . . , 6} include switching power amplifiers of class F or class S. In other embodiment PAs 454-{1, . . . , 6} may include power amplifiers of class A, B, AB or C.

The outputs of PAs 455, 456, 457, 458, 459 and 460 are coupled together in a combiner 461 using well known combining techniques such as active combiners or other techniques such as Wilkison, hybrid or transformers. Alternatively, the outputs of PAs 455, 456, 457, 458, 459 and 460 can be coupled through inductances and/or capacitances for a minimal power loss. Amplification stage embodiments according to power amplification methods and systems of the present invention will further described in section 3.1.

The combiner's output signal 462 is submitted to a bandpass filter 463 with central frequency equal to the desired frequency of the output signal, being the signal 464 the desired amplified signal.

In another embodiment a bias circuit 465 can be employed to provide bias signals 466-{1, . . . , 6} to the PAs. In another embodiment a phase control circuit 467 could be also employed to provide control signals 468-{1, . . . , 6} to compensate any phase shifts among amplifiers.

Figure 4B:
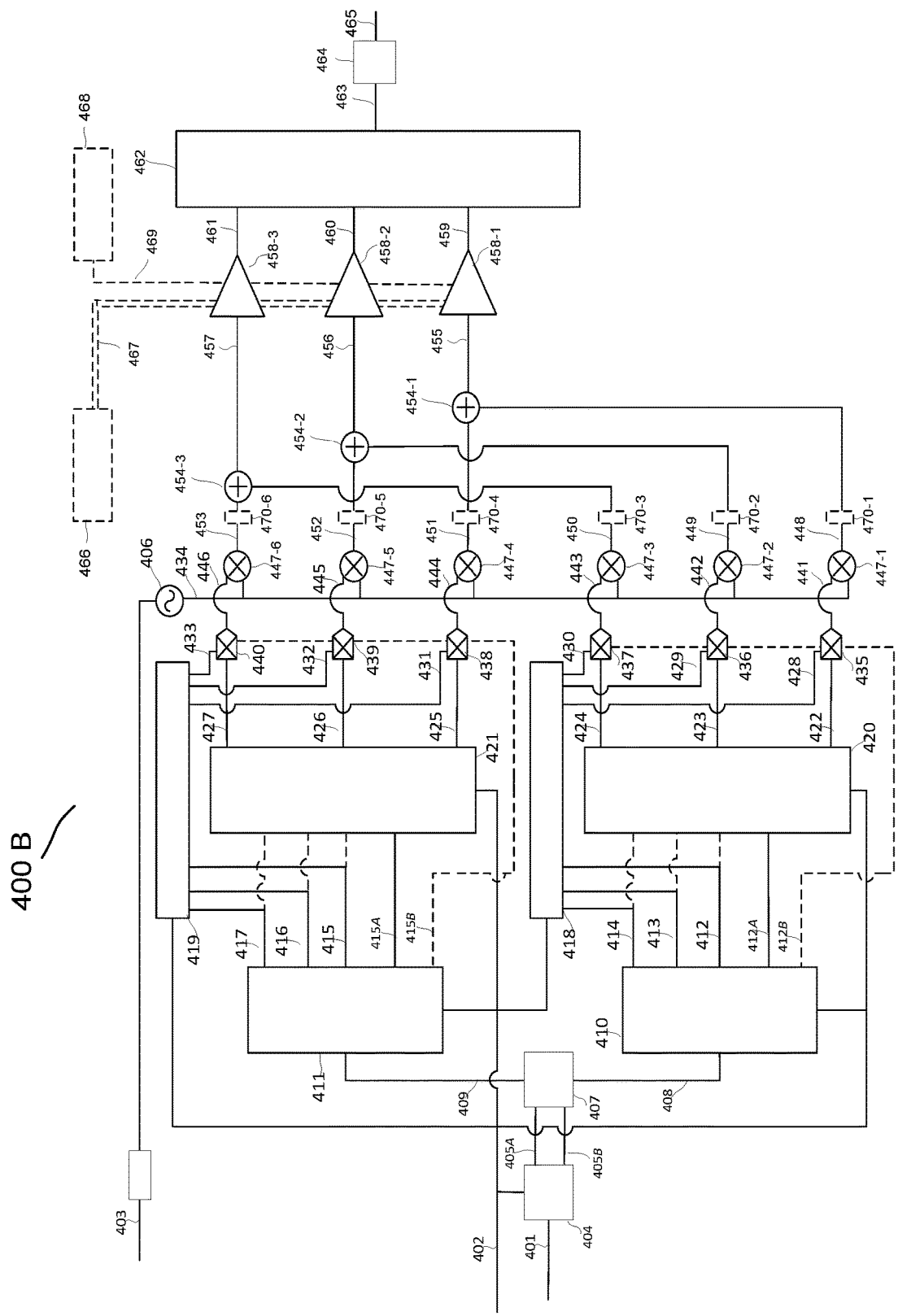
FIG. 4B is a block diagram that illustrates another exemplary embodiment of a signal power amplification apparatus for implementing the I/Q analog to analog converter with quantized Digital controlled amplification method with constituent signals resulting from the sum of in-phase and quadrature constituent components of the quantized sample of the input signal.

Block diagram 400B of FIG. 4B is an example that illustrates an exemplary embodiment of the IQQDCA, implementing the process flowchart 300 of FIG. 3 using optional step 310B. In the example of FIG. 4B, optional components are illustrated with dashed lines. In other embodiments, additional components may be optional.

In this example a time varying envelope signal 401, a clock reference signal 402 for the sampling process and a channel clock 403 with the desired frequency for the output signal are received as inputs. In another embodiment 401 can be the samples of a time-variant envelope signal and the S/H 407 is not required. In another embodiment the input signal 401 can be the samples of the in-phase and quadrature components of a time varying envelope signal and the phase splitter 404 and the S/H are not required.

The clock reference signal 402 can be used by the S/H block 407, by the two quantizers 410 and 411 and by the polar converters 418 and 419. It can be understood by a person skilled in the art that the choice of the clock reference signal is made according the bandwidth of the input signal and the desired output signal. As understood by a person skilled in the art other reference clock signals and different reference clock signals may be used by the different blocks. It is noted that two 3 bit quantizers and 3 amplification branches are employed in this embodiment for purposes of illustration, and not limitation. The scope of the invention covers the use of other numbers of branches, and implementation of such variations will be apparent to persons skilled in the art based on the teachings contained herein. It is also important to note that in certain embodiments of the present invention the quantizers employed to quantize the values of the samples of the in-phase and quadrature components may have different number of quantization levels and quantization bits.

The input signal 401 is submitted to the phase splitter 404 that generates the in-phase component 405A and quadrature component 405B and releases them to the S/H 407. The S/H circuit 407 samples the in-phase 405A and the quadrature component 405B of the received signal according to a clock signal 402 and generates the in-phase samples 408 and quadrature samples 409. The sample of the in-phase component 408 is submitted to a 3 bit quantizer 410 that generates 3 bit signals 412, 413, and 414, an end of conversion signal 412A to be used as control signal in the constituent signal mapper 420 and a polar signal representing the sign of the sample value 412b. The sample of the quadrature component 409 is submitted to a 3 bit quantizer 410 that generates 3 bit signals 415, 416, and 417, an end of conversion signal 415A to be used as control signal in the constituent signal mapper 421 and a polar signal representing the sign of the sample 415b. Signals 412, 413, 414 and signals 415, 416, and 417 are provided to bit polar converters 418 and 419, that generate the signals 428, 429 and 430 and the signals 431, 432 and 433 that are the polar versions of the signals 412, 413, 414 and signals 415, 416, and 417, respectively. In other embodiment signals 412, 413, 414 and signals 415, 416, and 417 may be provided to the constituent signal mappers.

The signals of the in-phase component 412, 413, and 414 are provided to the in-phase constituent signal mapper 420 that generates the signals 422, 423 and 424 with amplitudes that correspond to the coefficients associated to each bit. Amplitudes of 422, 423 and 424 correspond to the coefficients g1, g2 and g4. The signals 422, 423 and 424 are multiplied by the corresponding polar signals 428, 429, and 430 to generate the in-phase constituent components 441, 442 and 443 that correspond to the signals $s_{1I}$, $s_{2I}$ and $s_{4I}$, associated to the decomposition of the in-phase component of the quantized value. In another embodiment the signals 422, 423 and 424 are multiplied in 435, 436 and 437 by the corresponding polar signals 428, 429, 430 and the polar signal 412b to generate the in-phase constituent components 441, 442 and 443 that correspond to the signals $s_{1I}$, $s_{2I}$ and $s_{4I}$, associated to the decomposition of the in-phase component of the quantized value. The signal mapper also generates for each constituent signal a pulse shape to assure good spectral efficiency and power efficiency.

The signals of the quadrature component 415, 416, and 417 are provided to the quadrature constituent signal mapper 421 that generates the signals 425, 426 and 427 with amplitudes that correspond to the coefficients associated to each bit. Amplitudes of 425, 426 and 427 correspond to the coefficients g1, g2 and g4 related with the decomposition of the quadrature value into constituent signals. The signals 425, 426 and 427 are multiplied by the polar signals 431, 432, and 433 to generate the quadrature constituent components 444, 445 and 446 that correspond to the signals $s_{1Q}$, $s_{2Q}$ and $s_{4Q}$, associated to the decomposition of the quadrature component of the quantized value. In another embodiment the signals 425, 426 and 427 are multiplied in 438, 439 and 440 by the polar signals 431, 432, 433 and the polar signal 415b to generate the quadrature constituent components 444, 445 and 446 that correspond to the signals $s_{1Q}$, $s_{2Q}$ and $s_{4Q}$, associated to the decomposition of the quadrature component of the quantized value. In-phase constituent signals 448, 449 and 450 are obtained by multiplying in 447-1, 447-2 and 447-3 the signals 441, 442 and 443 by a periodic pulse signal 434 with the desired frequency for the output signal generated by 406. Quadrature constituent signals 451, 452 and 453 are obtained by multiplying in 447-4, 447-5 and 447-6 the signals 444, 445 and 446 by a periodic pulse signal 434 with the desired frequency for the output signal generated by 406.

In other embodiments the signal 434 can be a sinusoidal signal or a pulse train signal with frequency selected according to the desired frequency of the output signal.

In 454-1, 454-2 and 454-3 each in-phase constituent signal 448, 449 and 450 is summed with the corresponding quadrature constituent signal 451, 452 and 453 with the same amplitude, i. e. each in-phase component is combined with the corresponding quadrature component with the same amplitude to generate the constituent complex signals 455, 456 and 457. Constituent signals 455, 456 and 457 have quasi or constant envelope are the inputs of the corresponding PAs 458-{1, . . . , 3} of the amplification stage that may be non-linear power amplifiers.

In another embodiment PAs 458-$\{1, \ldots, 3\}$ include switching power amplifiers of class D. In another embodiment PAs 458-$\{1, \ldots, 3\}$ include switching power amplifiers of class E. In another embodiment PAs 458-$\{1, \ldots, 3\}$ include switching power amplifiers of class F or class S. In other embodiment PAs 458-$\{1, \ldots, 3\}$ may include power amplifiers of class A, B, AB or C.

The outputs of PAs 459, 460 and 461 are coupled together in a combiner 462 using well known combining techniques such as active combiners or other techniques such as Wilkison, hybrid or transformers. Alternatively, the outputs of PAs 459, 460 and 461 can be coupled through inductances and/or capacitances for a minimal power loss. Amplification stage embodiments according to power amplification methods and systems of the present invention will further described in section 3.1.

The combiner's output signal 463 is submitted to a bandpass filter 464 with central frequency equal to the desired frequency of the output signal, being the signal 465 the desired amplified signal.

In another embodiment a bias circuit 466 can be employed to provide bias signals 467-$\{1, \ldots, 3\}$ to the PAs. In another embodiment a phase control circuit 468 could be also employed to provide control signals 469-$\{1, \ldots, 3\}$ to compensate any phase shifts among amplifiers.

In other embodiment voltage-to-current or current-to-voltage converters 470-$\{1, \ldots, 6\}$ may be employed before the sum of the in-phase and quadrature constituent signals with same amplitude performed in 454-$\{1, \ldots, 3\}$. It is important to mention that as understood by a person skilled in the art that the voltage-to-current or the current-to-voltage converters 470-$\{1, \ldots, 6\}$ may be embedded in the sum operations or in the multiplications performed in 447-$\{1, \ldots, 6\}$.

2.3 On/Off Quantized Digital Controlled Amplification (OOQDCA)

According to one embodiment of the invention, herein called On/Off quantized digital controlled amplification (OOQDCA), for ease of illustration and not limitation, a time-varying envelope signal is decomposed into 6 substantially constant envelope constituent signals that may be active or inactive. The in-phase and quadrature constituent signals are amplified individually, and then summed to construct an amplified version of the original time-varying envelope signal.

According to another embodiment of the invention, herein called OOQDCA with complex components (OOQDCAC), for ease of illustration and not limitation, a time-varying envelope signal is decomposed into 6 substantially constant envelope constituent signals that may be active or inactive. The active in-phase and quadrature components with same amplitude are summed to generate complex constituent signals that are amplified individually, and then summed to construct an amplified version of the original time-varying envelope signal.

It is noted that 6 amplification or 3 amplification branches are employed in these embodiments, it is also assumed DRi=DRq and the same number of quantization bits for in-phase and quadrature components for purposes of illustration, and not limitation. The scope of the invention covers the use of other numbers of branches, DR≠DRq and different number of quantization bits for the in-phase and quadrature components and implementation of such variations will be apparent to persons skilled in the art based on the teachings contained herein.

According to the OOQDCA and OOQDCAC embodiments the time domain sample of the complex envelope in-phase component $s_{nI}$ can be transformed into a quantized symbol $s_{nI,QT}$ taken from a finite alphabet of $2^{N_b}$ possible quantization symbols that are represented as a sum of unipolar components. Also, the time domain sample of the complex envelope quadrature component $s_{nQ}$ can be transformed into a quantized symbol $s_{nQ,QT}$ taken from a finite alphabet of $2^{N_b}$ possible quantization symbols that are decomposed as a sum of unipolar components. For the quantization of each component are employed $N_b+1$ bits, where one bit is a polarity bit and the $N_b$ quantization bits and $N_{QL}=2^{N_b}$ quantization levels applied in each component are defined in terms of the maximum quantization errors $$\varepsilon_{Qi} = \frac{DRi}{2 \times 2^{N_b}} = \frac{\Delta i}{2} \text{ and } \varepsilon_{Qq} = \frac{DRq}{2 \times 2^{N_b}} = \frac{\Delta q}{2},$$

with $\Delta i$ and $\Delta q$ denoting the quantization interval for the in-phase component and the quantization interval for the quadrature component, respectively. Additional bits $\beta_{nI}^{(N_b)}$ and $\beta_{nq}^{(N_b)}$ are used to indicate the polarity of the quantized value. For each component $N_b$ quantization bits $(\beta_{nI}^{(N_b-1)}, \beta_{nI}^{(N_b-2)}, \ldots, \beta_{nI}^{(1)}, \beta_{nI}^{(0)})$ and $(\beta_{nq}^{(N_b-1)}, \beta_{nq}^{(N_b-2)}, \ldots, \beta_{nq}^{(1)}, \beta_{nq}^{(0)})$ are employed in the definition of $N_m \leq N_b$ unipolar components in which each quantization level can be decomposed. Both polarity bits $\beta_{nI}^{(N_b)}$ and $\beta_{nq}^{(N_b)}$ are converted into polar forms by $$b_{nI}^{(N_b)} = (-1)^{\beta_{nI}^{(N_b)}} \text{ and } b_{nq}^{(N_b)} = (-1)^{\beta_{nq}^{(N_b)}}.$$

Both finite sets of quantizer symbols $\mathfrak{S}_I = \{s_{I,0}, s_{I,1}, \ldots, s_{I,N_{QL}-1}\}$ and $\mathfrak{S}_Q = \{s_{q,0}, s_{q,1}, \ldots, s_{q,N_{QL}-1}\}$ follow the rules $(\beta_{nI}^{(N_b-1)}, \beta_{nI}^{(N_b-2)}, \ldots, \beta_{nI}^{(1)}, \beta_{nI}^{(0)}) \mapsto s_{nI,QT} \in \mathfrak{S}$ and $(\beta_{nq}^{(N_b-1)}, \beta_{nq}^{(N_b-2)}, \ldots, \beta_{nq}^{(1)}, \beta_{nq}^{(0)}) \mapsto s_{nq,QT} \in \mathfrak{S}$.

Each symbol from the finite set of in-phase components of the quantizer symbols $\mathfrak{S}_I = \{s_{I,0}, s_{I,1}, \ldots, s_{I,N_{QL}-1}\}$, can be represented as a sume of $N_{mI} \leq N_b$ unipolar components that are the result of the decomposition of quantization value $s_{nI,QT}$ into polar components, given by $$s_{nI,QT} = b_{nI}^{(N_b)}(g_0 + g_1\beta_{nI}^{(0)} + g_2\beta_{nI}^{(1)} + g_3\beta_{nI}^{(0)}\beta_{nI}^{(1)} + g_4\beta_{nI}^{(2)} + \cdots)$$

$$= b_{nI}^{(N_b)} \sum_{i=0}^{N_{mI}-1} g_i \prod_{m=0}^{N_{mI}-1} (\beta_{nI}^{(m)})^{\gamma_{m,i}} = b_{nI}^{(N_b)} \sum_{i=0}^{N_{mI}-1} g_i \beta_{nI}^{eq(i)},$$

with $(\gamma_{N_{mI}-1,i}, \gamma_{N_{mI}-2,i}, \ldots, \gamma_{1,i}, \gamma_{0,i})$ denoting the binary representation of i, $\beta_{nI}^{eq(i)} = \prod_{m=0}^{N_{mI}-1} (\beta_{nI}^{(m)})^{\gamma_{m,i}}$ and $N_{mI}$ is the number of non-zero $g_i$ real coefficients of the referred decomposition (the total number of coefficients is $2^{N_b}-1$). For example, for $N_b=3$ and a symmetrical dynamic range (using as reference the zero value) the quantization levels are $\pm 7\Delta, \pm 5\Delta, \pm 3\Delta, \pm \Delta$, which can be given by $$s_{nI,QT} = b_{nI}^{(N_b)}(g_1\beta_{nI}^{(0)} + g_2\beta_{nI}^{(1)} + g_4\beta_{nI}^{(2)})$$

where $g_{1I}=\Delta$, $g_{2I}=2\Delta$, $g_{4I}=4\Delta$, $b_{nI}^{(N_b)}=\pm 1$ and $g_0=g_3=g_5=g_6=g_7=0$. For each quantized value only a number of components equal to the number of bits at one in the set of bits $(\beta_{nI}^{(2)}, \beta_{nI}^{(1)}, \beta_{nI}^{(0)})$ are active at the mapper's output.

For the quadrature component each symbol from the finite set of quantizer symbols $Q=\{s_{q,0}, s_{q,1}, \ldots, s_{q,N_{QL}-1}\}$, can be represented as a sum of $N_{mQ} \leq N_b$ unipolar components, that are the result of the decomposition of quantization value $s_{nq,QT}$ into polar components given by $$s_{nq,QT} = b_{nq}^{(N_b)}(g_0 + g_1\beta_{nq}^{(0)} + g_2\beta_{nq}^{(1)} + g_3\beta_{nq}^{(0)}\beta_{nq}^{(1)} + g_4\beta_{nq}^{(2)} + \cdots)$$

$$= b_{nq}^{(N_b)} \sum_{i=0}^{N_{mQ}-1} g_i \prod_{m=0}^{N_{mQ}-1} (\beta_{nq}^{(m)})^{\gamma_{m,i}} = b_{nl}^{(N_b)} \sum_{i=0}^{N_{mQ}-1} g_i \beta_{nq}^{eq(i)},$$

with $b_{nq}^{eq(i)} = \prod_{m=0}^{N_{mQ}-1} (b_{nq}^{(m)})^{\gamma_{m,i}}$ and $N_{mQ}$ is the number of non-zero $g_i$ imaginary coefficients of the referred decomposition (the total number of coefficients is $2^{N_b}-1$). For example, for $N_b=3$ and a symmetrical dynamic range (using as reference the zero value) the quantization levels are $\pm j7\Delta$, $\pm j5\Delta$, $\pm j3\Delta$, $\pm j\Delta$, which can be given by $$s_{nq,QT} = b_{nq}^{(Nb)}(g_1 b_{nq}^{(0)} + g_2 b_{nq}^{(1)} + g_4 b_{nq}^{(2)})$$

with $g_{1Q}=j\Delta$, $g_{2Q}=j2\Delta$, $g_{4Q}=j4\Delta$ and $g_0=g_3=g_5=g_6=g_7=0$.

Again, instead $N_{mQ}$ components only a number of components equal to the number of bits at one in the set of bits are active at the mapper's output. Each one of the $N_{mI}$ and $N_{mQ}$ polar components with amplitude $g_i$ can be modulated as a BPSK signal. Note that the pulse shape employed in each BPSK signal can be selected to achieve high spectral efficiency and constant envelope. In the OOIQQDCA embodiment the in-phase and quadrature components are used to generate constituent signals with quasi constant or constant envelope that are individually amplified. In the OOIQQDCAC embodiment the in-phase and quadrature components whit same amplitude are also combined to generate constituent signals with quasi constant or constant envelope that are individually amplified.

Figure 5:
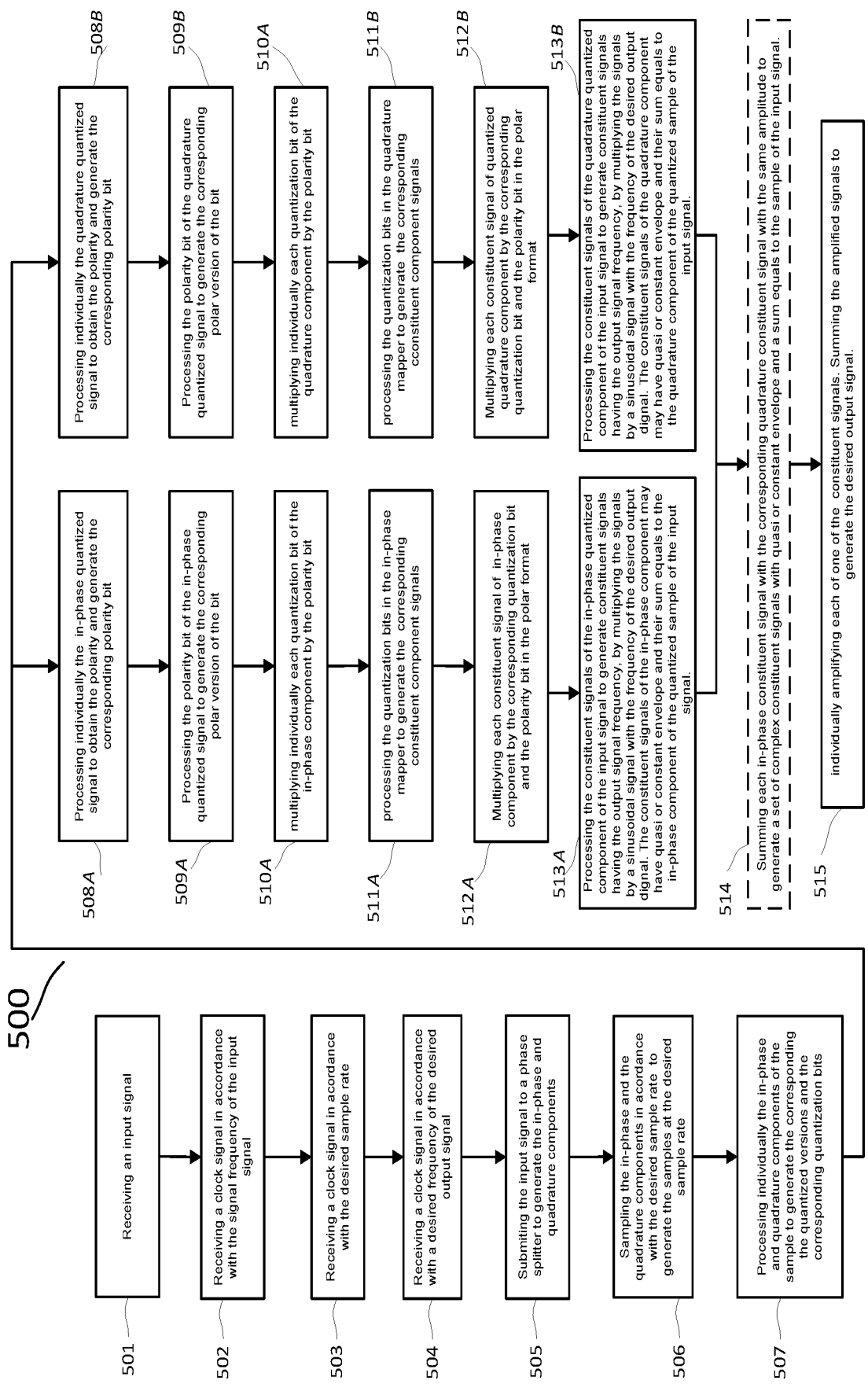
FIG. 5 is a process flowchart embodiment for power amplification according to the On/Off analog to analog converter with quantized digital controlled amplification method.

Operation of the OOQDCA and OOQDCAC embodiments shall be described further with reference to the flowchart of FIG. 5. Optional steps are illustrated with dashed lines. The process starts at step 501, which includes receiving a time varying envelope signal. In another embodiment this involves receiving the desired RF signal. In another embodiment this involves receiving the desired IF signal. In another embodiment this involves receiving the samples of the desired input signal or the samples of the in-phase and quadrature components of the time varying envelope signal.

Step 502 includes receiving a clock signal set according to the signal frequency of the input signal.

Step 503 includes receiving a clock signal set according to a desired sample rate of the input signal. It is important to mention that as understood by a person skilled in the art the sample rate may vary according to the bandwidth of the input signal and the desired time resolution of the sampling process.

Step 504 includes receiving a clock signal in accordance with a desired output signal frequency of the desired output signal.

Step 505 includes processing the input signal to generate in-phase and quadrature components.

Step 506 includes sampling the in-phase and quadrature components in accordance with the sampling rate to generate the samples of these components.

Step 507 includes processing individually by a quantizer the in-phase and quadrature components to generate the quantization bits and the corresponding quantized value of the in-phase and the quantization bits and the corresponding quantized value of the quadrature component, respectively. As understood by a person skilled in the art based on the teaching herein, step 507 can be performed by a block using a single quantizer. Also as understood by a person skilled in the art based on the teaching herein, step 507 can be performed by a comparator and a LUT with the corresponding quantization bits of the quantized values.

Step 508A includes processing individually the quantized value of the in-phase component to obtain the polarity and generate the corresponding polarity bit. Step 508B includes processing individually the quantized value of the quadrature component to obtain the polarity and generate the corresponding polarity bit.

Steps 509A and 509B include processing individually the polarity bit of the quantized value of the in-phase component to generate the corresponding polar representation and processing individually the polarity bit of the quantized value of the quadrature component to generate the corresponding polar representation.

Steps 510A and 510B include multiplying individually each quantization bit corresponding to the quantized value of the in-phase component by the polar signal of the polarity bit of the quantized in-phase component and multiplying individually each quantization bit corresponding to the quantized value of the quadrature component by the polar signal of the polarity bit of the quantized quadrature component, respectively.

Step 511A includes processing individually in a mapper the quantization bits associated to the quantized in-phase component to map them into the corresponding constituent signals. Step 511B includes processing individually in a mapper the quantization bits associated to the quantized quadrature component to map them into the corresponding constituent signals.

Steps 512A and 512B include multiplying the constituent signals of the quantized in-phase component by the signals that result from step 510A and multiplying the constituent signals of the quantized quadrature component by the signals that result from step 510B.

Step 513A includes processing the in-phase component signals that resulted from step 512A by multiplying the signals by a periodic pulse signal with the desired output signal frequency. The resulting quantized in-phase constituent signals may have quasi or constant envelopes and a sum equal to the in-phase component of the quantized sample of the input signal.

Step 513B includes processing the quadrature component signals that resulted from step 512B by multiplying the signals by a periodic pulse signal with the desired output signal frequency. The resulting quantized quadrature constituent signals may have quasi or constant envelopes and a sum equal to the quadrature component of the quantized sample of the input signal. Step 514 is an optional step that includes processing the signals that resulted from steps 513A and 513B, by summing the in-phase signals with the quadrature signals with the same amplitude to generate a set of complex constituent signals with quasi or constant envelopes and a sum equal to the quantized sample of the input signal Step 515 includes individually amplifying each of one of the constituent signals, and summing the amplified signals to generate the desired output signal.

Figure 6A:
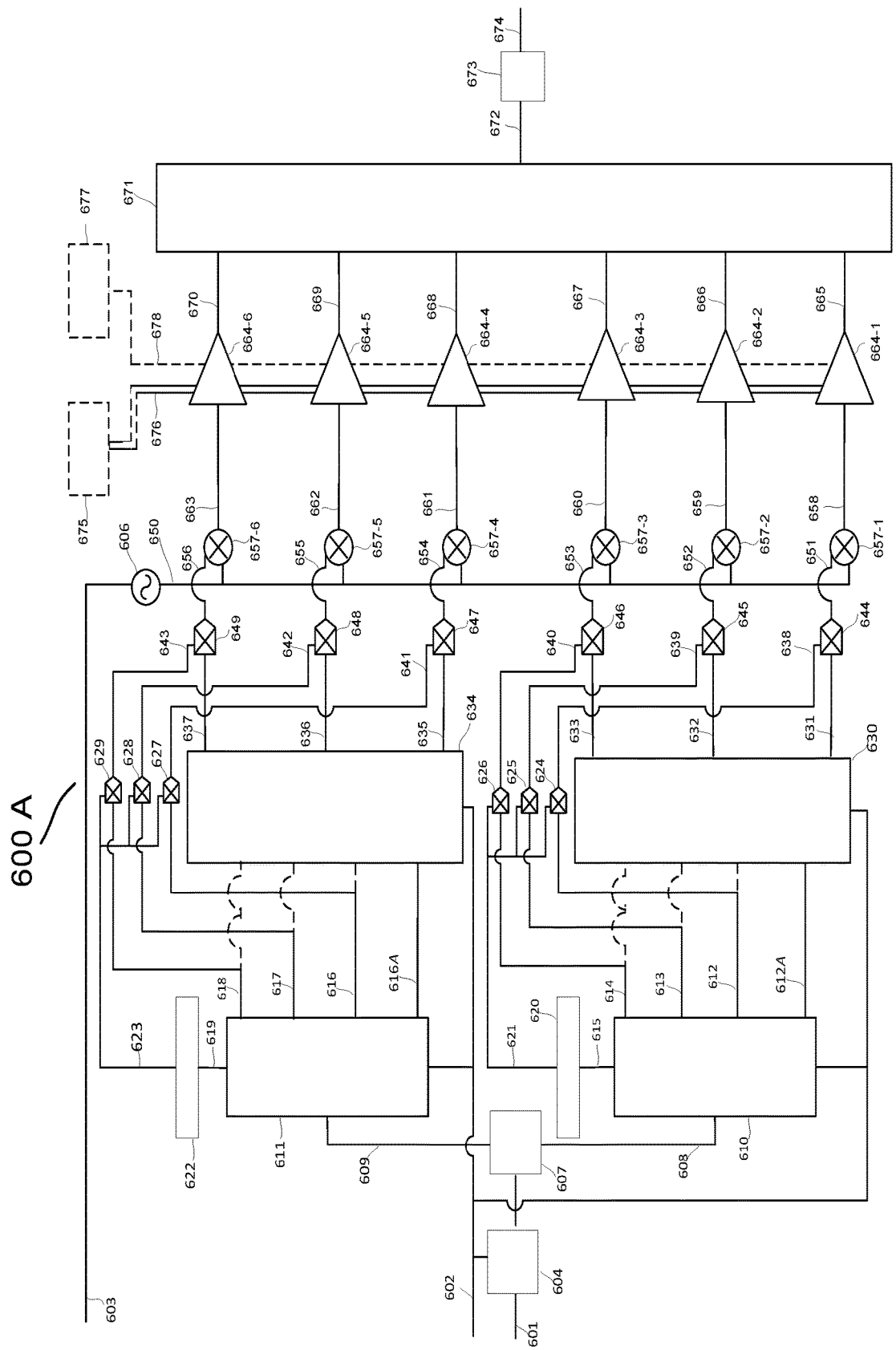
FIG. 6A is a block diagram that illustrates an exemplary embodiment of signal power amplification apparatus for implementing the On/Off analog to analog converter with quantized digital controlled amplification method with the constituent signals the in-phase and the quadrature components of the quantized sample of the input signal.

Block diagram 600A of FIG. 6A is an example that illustrates an exemplary embodiment of the OOQDCA, implementing the process flowchart 500 of FIG. 5, without the optional step 514. In the example of FIG. 6A, optional components are illustrated with dashed lines. In other embodiments, additional components may be optional.

In this example a time varying envelope signal 601, a clock reference signal 602 for the sampling process and a channel clock 603 with the desired frequency for the output signal are received as inputs. In another embodiment 601 can be the samples of a time varying envelope signal and the S/H 607 is not required. In another embodiment 601 can be the samples of the in-phase and quadrature components of a time varying envelope signal and 604 and 607 are not required.

The clock reference signal 602 can be used by the S/H 607, by the two quantizers 610 and 611 and by the polar converters 620 and 622. It can be understood by a person skilled in the art that the choice of the clock reference signal is made according the bandwidth of the input signal and the desired output signal. As understood by a person skilled in the art other reference clock signals and different reference clock signals may be used by the different blocks. It is noted that two 3 bit quantizers and 6 amplification branches are employed in this embodiment only for purposes of illustration, and not limitation. The scope of the invention covers use of other numbers of branches, and implementation of such variations will be apparent to persons skilled in the art based on the teachings contained herein.

The phase splitter 604 receives the input signal 601 and generates the in-phase and quadrature components 605*a* and 605*b*, respectively.

The S/H circuit 607 samples the received signal according to a clock signal 602 and generates the time samples the in-phase component 608 and the time samples of the quadrature component 609. The sample of the in-phase component 608 is converted by the quantizer 610 into 3 quantization bit signals 612, 613, and 614, one polarity bit signal 615 and one end of conversion bit signal 612*a*. The sample of the quadrature component 609 is converted by the quantizer 611 into 3 bit signals 616, 617, and 618, one polarity bit signal 619 and one end of conversion bit signal 616*a* to be used to control the constituent signal mapper. Signal 615 is submitted to a polar converter 620 that generates the polar signal 621. Also the polarity bit signal 619 of the quadrature component is provided to a polar converter 622 that generates the polar signal 623.

The quantization bit signals 612, 613 and 614 are multiplied in 624, 625 and 626 by the polar signal 621 to generate the signals 639, 640 and 641. The quantization bit signals 616, 617 and 618 are multiplied in 627, 628 and 629 by the polar signal 623.

The signal 612*a* is applied to the in-phase constituent signal mapper 630 that generates the signals 631, 632 and 633 with amplitudes that correspond to the coefficients associated to each bit. In another embodiment the signals 612, 613, and 614 are provided to the in-phase constituent signal mapper 630 that generates the signals 631, 632 and 633 with amplitudes that correspond to the coefficients associated to each bit. Amplitudes of 631, 632 and 633 correspond to the coefficients $g_{1I}$, $g_{2I}$ and $g_{4I}$. Each signal 631, 632 and 633 is multiplied individually in 624, 625 and 626 by the result of the product of the corresponding quantization bit and the polarity bit 621 to generate the signals 638, 639 and 640. The in-phase constituent components 631, 632 and 633 are multiplied in 644, 645 and 646 by the signals 638, 639 and 640 to generate the signals 651, 652 and 653 that correspond to the signals $s_{1I}$, $s_{2I}$ and $s_{4I}$, associated to the decomposition of the in-phase component of the quantized value. Each signal mapper also generates for each constituent signal component a pulse shape to assure good spectral efficiency and power efficiency.

The signal 616*a* is applied to the quadrature constituent signal mapper 634 that generates the signals 635, 636 and 637 with amplitudes that correspond to the coefficients associated to each bit. In another embodiment the signals 616, 617, and 618 are provided to the quadrature constituent signal mapper 634 that generates the signals 635, 636 and 637 with amplitudes that correspond to the coefficients associated to each bit. Amplitudes of 635, 636 and 637 correspond to the coefficients $g_{1Q}$, $g_{2Q}$ and $q_{4Q}$. Each signal 635, 636 and 637 is multiplied individually in 627, 628 and 629 by the result of the product of the corresponding quantization bit and the polarity bit 623 to generate the signals 641, 642 and 643. The quadrature constituent components 635, 636 and 637 are multiplied in 647, 648 and 649 by the signals 641, 642 and 643 to generate the signals 654, 655 and 656 that correspond to the signals $s_{1Q}$, $s_{2Q}$ and $s_{4Q}$, associated to the decomposition of the quadrature component of the quantized value.

In-phase constituent signals 659, 660 and 661 are obtained by multiplying in 657-{1, . . . , 3} the signals 651, 652 and 653 by a periodic pulse signal 650 with the desired frequency for the output signal generated by 606. Quadrature constituent signals 661, 662 and 663 are obtained by multiplying in 657-{4, . . . , 6} the signals 654, 655 and 656 by a periodic pulse signal 651 with the desired frequency for the output signal generated by 606.

In other embodiments the signal 650 can be a sinusoidal signal or a pulse train signal with frequency selected according to the desired frequency of the output signal.

The constituent signals 658, 650, 660, 661, 662 and 663 with quasi and/or constant envelope are the inputs of the corresponding PAs 664-{1, . . . , 6} of the amplification stage, that may be non-linear power amplifiers. In another embodiment PAs 664-{1, . . . , 6} include switching power amplifiers of class D. In other embodiments PAs 664-{1, . . . , 6} include switching power amplifiers of class E or class F.

The outputs of PAs 665, 666, 667, 668, 669 and 670 are coupled together in a combiner 671 using well known combining techniques such as active combiners or other techniques such as Wilkison, hybrid or transformers. Alternatively, the outputs of PAs 664-{1, . . . , 6} can be coupled through inductances and/or capacitances for a minimal power loss. Amplification stage and combiner stage embodiments according to power amplification methods and systems of the present invention will further described in section 3.1.

The output signal from the combiner 672 is submitted to a bandpass filter 673 with central frequency equal to the desired frequency of the output signal, being the signal 674 the desired amplified signal.

In another embodiment a self bias circuit 676 can be employed to provide bias signals 676-{1, . . . , 6} to the PA's. In another embodiment a phase control circuit 677 could be also employed to generate control signals 678-{1, . . . , 6} to compensate any phase shifts among amplifiers.

Figure 6B:
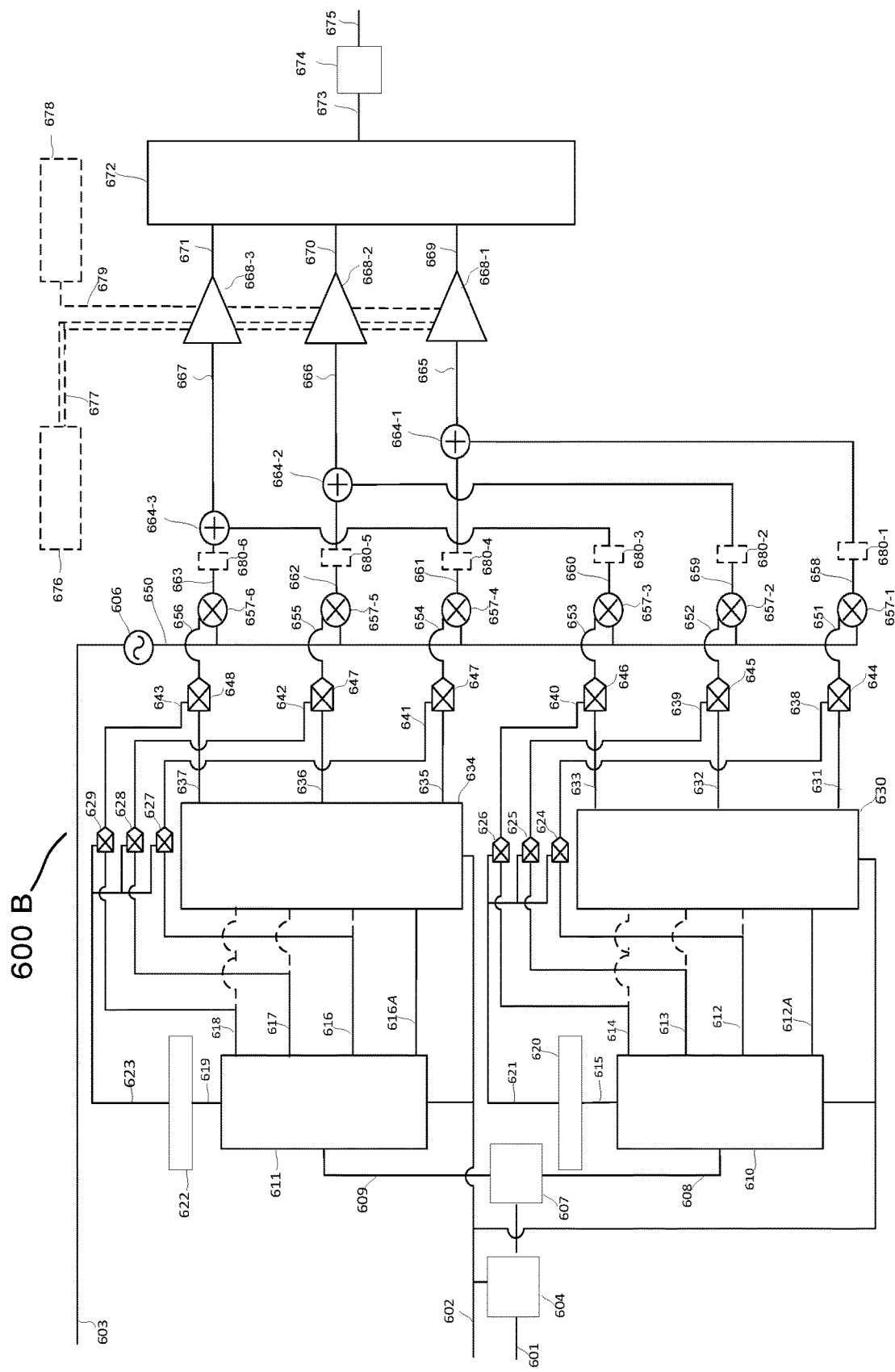
FIG. 6B is a block diagram that illustrates an exemplary embodiment of signal power amplification apparatus for implementing the On/Off analog to analog converter with quantized digital controlled amplification method with constituent signals resulting from the sum of in-phase and quadrature constituent components of the quantized sample of the input signal.

Block diagram 600B of FIG. 6B is an example that illustrates an exemplary embodiment of the OOQDCA, implementing the process flowchart 500 of FIG. 5, with the optional step 514. In the example of FIG. 6B, optional components are illustrated with dashed lines. In other embodiments, additional components may be optional.

In this example a time varying envelope signal 601, a clock reference signal 602 for the sampling process and a channel clock 603 with the desired frequency for the output signal are received as inputs. In another embodiment 601 can be the samples of a time varying envelope signal and the S/H 607 is not required. In another embodiment 601 can be the samples of the in-phase and quadrature components of a time varying envelope signal and 604 and 607 are not required.

The clock reference signal 602 can be used by the S/H 607, by the two quantizers 610 and 611 and by the polar converters 620 and 622. It can be understood by a person skilled in the art that the choice of the clock reference signal is made according the bandwidth of the input signal and the desired output signal. As understood by a person skilled in the art other reference clock signals and different reference clock signals may be used by the different blocks. It is noted that two 3 bit quantizers and 3 amplification branches are employed in this embodiment for purposes of illustration, and not limitation. The scope of the invention covers use of other numbers of branches, and implementation of such variations will be apparent to persons skilled in the art based on the teachings contained herein.

The phase splitter 604 receives the input signal 601 and generates the in-phase and quadrature components 605a and 605b, respectively.

The S/H circuit 607 samples the received signal according to a clock signal 602 and generates the samples the in-phase component 608 and the samples of the quadrature component 609. The sample of the in-phase component 608 is converted, by the quantizer 610, into 3 quantization bit signals 612, 613, and 614, one polarity bit signal 615 and one end of conversion bit signal 612a. The sample of the quadrature component 609 is converted, by the quantizer 611, into 3 bit signals 616, 617, and 618, one polarity bit signal 619 and one end of conversion bit signal 616a to be used to control the constituent signal mapper. Signal 615 is submitted to a polar converter 620 that generates the polar signal 621. Also the polarity bit signal 619 of the quandrature component is provided to a polar converter 622 that generates the polar signal 623.

The quantization bit signals 612, 613 and 614 are multiplied in 624, 625 and 626 by the polar signal 621 to generate the signals 638, 639 and 640. The quantization bit signals 616, 617 and 618 are multiplied in 627, 628 and 629 by the polar signal 623.

The signal 612a is applied to the in-phase constituent signal mapper 630 that generates the signals 631, 632 and 633 with amplitudes that correspond to the coefficients associated to each bit. In another embodiment the signals 612, 613, and 614 are provided to the in-phase constituent signal mapper 630 that generates the signals 631, 632 and 633 with amplitudes that correspond to the coefficients associated to each bit. Amplitudes of 631, 632 and 633 correspond to the coefficients $g_{1I}$, $g_{2I}$ and $g_{4I}$. Each signal 631, 632 and 633 is multiplied individually in 624, 625 and 626 by the result of the product of the corresponding quantization bit and the polarity bit 621 to generate the signals 638, 639 and 640. The in-phase constituent components 631, 632 and 633 are multiplied in 644, 645 and 646 by the signals 638, 639 and 640 to generate the signals 652, 653 and 654 that correspond to the signals $s_{1I}$, $s_{2I}$ and $s_{4I}$, associated to the decomposition of the in-phase component of the quantized value. Each signal mapper also generates for each constituent signal component a pulse shape to assure good spectral efficiency and power efficiency.

The signal 616a is applied to the quadrature constituent signal mapper 635 that generates the signals 635, 636 and 637 with amplitudes that correspond to the coefficients associated to each bit. In another embodiment the signals 616, 617, and 618 are provided to the quadrature constituent signal mapper 634 that generates the signals 635, 636 and 637 with amplitudes that correspond to the coefficients associated to each bit. Amplitudes of 635, 636 and 637 correspond to the coefficients $g_{1Q}$, $g_{2Q}$ and $g_{4Q}$. Each signal 635, 636 and 637 is multiplied individually in 627, 628 and 629 by the result of the product of the corresponding quantization bit and the polarity bit 623 to generate the signals 641, 642 and 643. The quadrature constituent components 635, 636 and 637 are multiplied in 647, 648 and 649 by the signals 641, 642 and 643 to generate the signals 654, 655 and 656 that correspond to the signals $s_{1Q}$, $s_{2Q}$ and $s_{4Q}$, associated to the decomposition of the quadrature component of the quantized value.

The In-phase constituent signals 658, 659 and 660 are obtained by multiplying in 657-{1, . . . , 3} the signals 651, 652 and 653 by a periodic pulse signal 650 with the desired frequency for the output signal generated by 606. The quadrature constituent signals 661, 662 and 663 are obtained by multiplying signals 654, 655 and 656 by a periodic pulse signal 650 with the desired frequency for the output signal generated by 606.

In other embodiments the signal 650 can be a sinusoidal signal or a pulse train signal with frequency selected according to the desired frequency of the output signal.

In 664-1, 664-2 and 664-3 each in-phase constituent signal 658, 659 and 660 is summed with the corresponding quadrature constituent signal 661, 662 and 663 with the same amplitude, i. e. each in-phase component is combined with the corresponding quadrature component with the same amplitude to generate the constituent complex signals 665, 666 and 667. Constituent signals 665, 666 and 667 have quasi or constant envelope and are the inputs of the corresponding power amplifiers (PAs) 668-{1, . . . , 3} of the amplification stage that may be non-linear power amplifiers.

The constituent signals 665, 666 and 667 have quasi and/or constant envelope and are the inputs of the corresponding PAs 668-{1, . . . , 3} of the amplification stage, that may be non-linear power amplifiers. In another embodiment PAs 668-{1, . . . , 3} include switching power amplifiers of class D. In other embodiments PAs 668-{1, . . . , 3} include switching power amplifiers of class E or class F.

The outputs of PAs 669, 670 and 671 are coupled together in a combiner 672 using well known combining techniques such as active combiners or other techniques such as Wilkison, hybrid or transformers. Alternatively, the outputs of PAs 669, 670 and 671 can be coupled through inductances and/or capacitances for a minimal power loss. Amplification stage and combiner stage embodiments according to power amplification methods and systems of the present invention will further described in section 3.1.

The output signal from the combiner 673 is submitted to a bandpass filter 674 with central frequency equal to the desired frequency of the output signal, being the signal 675 the desired amplified signal.

In another embodiment a self bias circuit 676 can be employed to provide bias signals 677-{1, . . . , 3} to the PAs. In another embodiment a phase control circuit 678 could be also employed to generate control signals 679-{1, . . . , 3} to compensate any phase shifts among amplifiers.

In other embodiment voltage-to-current or current-to-voltage converters 680-{1, . . . , 6} may be employed before the sum of the in-phase and quadrature constituent signals with same amplitude performed in 664-{1, . . . , 3}. It is important to mention that as understood by a person skilled in the art that the voltage-to-current or the current-to-voltage converters 680-{1, ..., 6} may be embedded in the sum operations or in the multiplications performed in 657-{1, ..., 6}.

3. MULTI AMPLIFIER AMPLIFICATION STAGE

One aspect of embodiments of the present invention lies in the multi amplifier amplification (MAA) stage. This is shown, for example, in FIG. 4A where the amplification stage has six PAs 451-{1, ..., 6} or in FIG. 4B where the amplification stage has three PAs 451-{1, ..., 3}. This is also shown in FIGS. 2A, 2B, 6A and 6B, for example. Various embodiments for MAA stage are described herein. While the following is described in the context of QDCA, it should be understood that the following teachings generally apply to coupling or summing the outputs of any active devices in any application.

In another aspect, amplification stage embodiments of the present invention can be controlled to increase the power efficiency of the amplifier by controlling the output stage's current according to the desired output power level.

In what follows, various amplification stage embodiments according to QDCA embodiments of the present invention are provided in section 3.1.

3.1. Multi Amplifier and Combiner Embodiments

Figure 7:
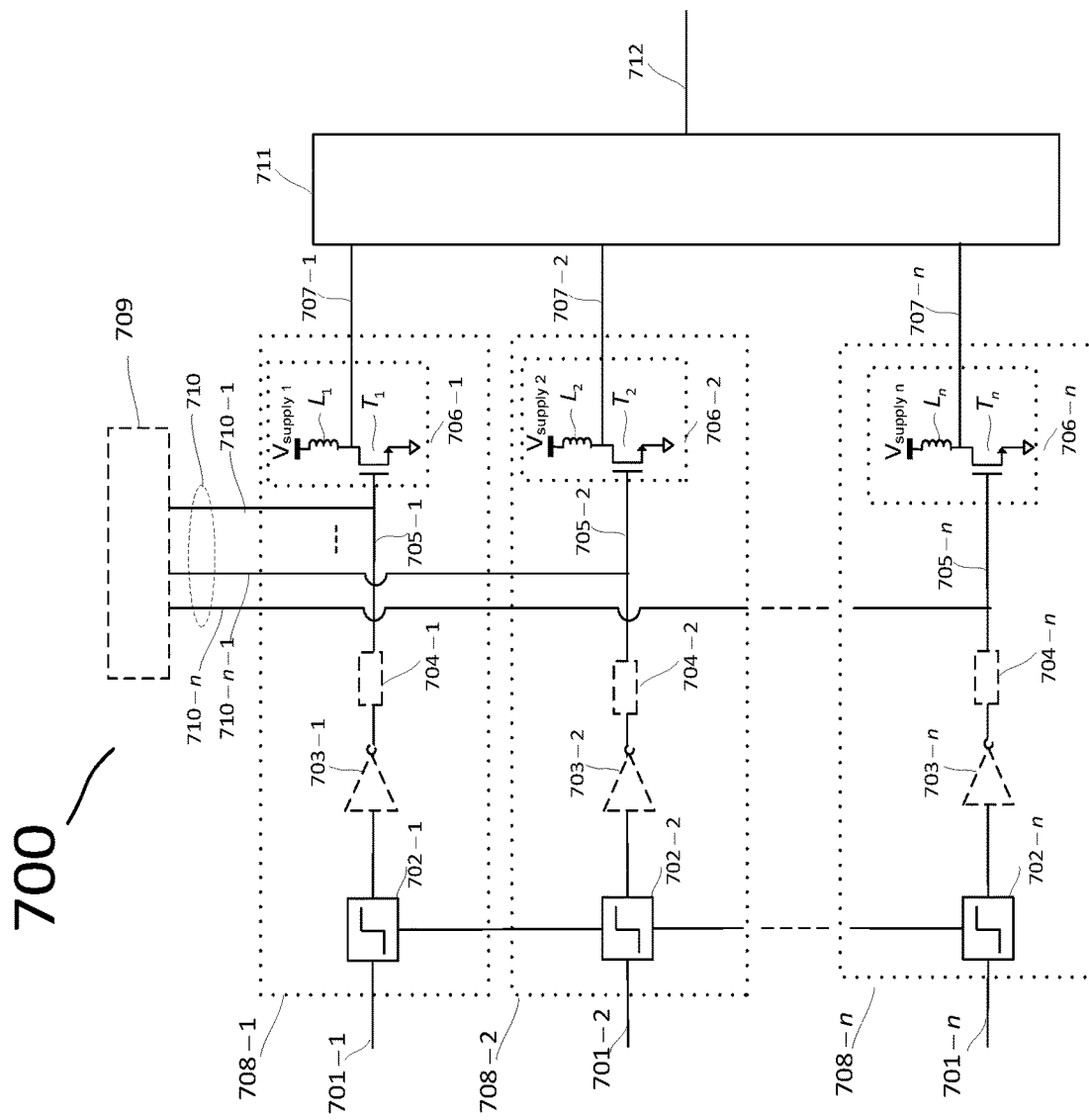
FIG. 7 is a block diagram that illustrates an exemplary embodiment for implementing a power amplification stage of analog to analog converter with quantized digital controlled amplification method using class F amplifiers.

Block diagram 700 of FIG. 7, illustrates a multi power amplifier stage embodiment 700 with class F amplifiers according to an embodiment of the present invention. Multi power amplifier stage embodiment 700 includes a plurality of PA branches 708-{1, ..., n}. Signals 701-{1, ..., n} incoming from respective the products of the constituent signals components by a periodic signal represent inputs for amplification stage 700. Referring FIGS. 2, 2A, 4, 4A, 6 and 6A, the input signals are the sets of signals 231, 232, 233, 234, 235 and 236, signals 237, 238 and 239, signals 448, 449, 450, 451, 452 and 453, signals 455, 456, 457, signals 658, 659, 660, 661, 662, 663 and signals 665, 666 and 667, respectively. According to this embodiment of the present invention, signals 701-{1, ..., n} represent the constant envelope constituent signals of a desired output signal of the power amplifier.

PA branches 708-{1, ..., n} apply equal or substantially equal power amplification to respective signals 701-{1, ..., n}. In an embodiment, the power amplification level through PA branches 708-{1, ..., n} is set according to a power level requirement of the desired output signal.

In the embodiment of FIG. 7, each PA branch 708-{1, ..., n} includes a limiter 702-{1, ..., n}, an optional driver 703-{1, ..., n}, an optional matching impedance 704-{1, ..., n} and a power amplifier 706-{1, ..., n}. In other embodiments, drivers 703-{1, ... n} as illustrated in FIG. 7, may also be added in a PA branch prior to the power amplifier element to reinforce the input signal 705-{1, ..., n}. In embodiments, drivers are employed whenever a required output power level may not be achieved in a single amplifying stage. According to embodiment 700, PAs 706-{1, ..., n} include switching power amplifiers. In the example of FIG. 7, power amplifiers 706-{1, ..., n} include Field Effect Transistor (FET) devices T1, ..., Tn, inductances L1, ..., Ln, and supply tensions $V_{suppply1}, \ldots, V_{supplyn}$. To generate the desired output signal, outputs of PA branches 707-{1, ..., n} are coupled at the combiner 711 to generate the output signal 712. Accordingly, minimal power loss is incurred in summing the outputs of PAs 707-{1, ... n}.

In another embodiment an optional bias circuit 709, as illustrated in FIG. 7, may be also employed to provide the bias signals 710-{1, ..., n} that control the amount of current flow through the PAs 706-{1, ... n}.

In one embodiment the combiner 711 is a near zero-impedance conducting wire that provides minimal isolation between the coupled outputs. It is noted that in certain embodiments of the present invention, output coupling, as shown in the embodiment of FIG. 7 or embodiments subsequently described below, may utilize certain output stage protection measures. These protection measures may be implemented at different stages of the PA branch. Further, the type of protection measures needed may be PA implementation-specific.

Figure 8:
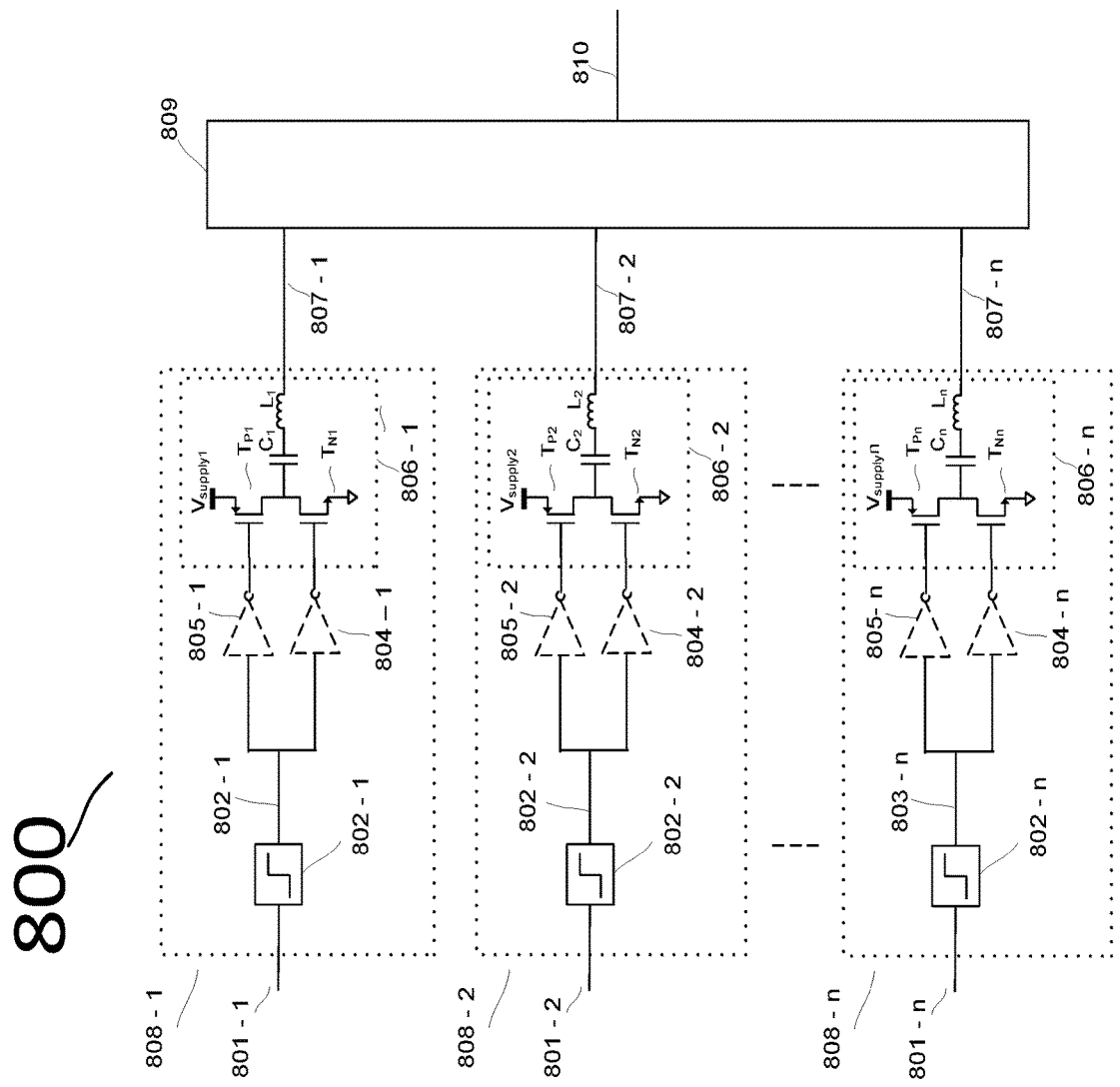
FIG. 8 is a block diagram that illustrates another exemplary embodiment for implementing a power amplification stage of analog to analog converter with quantized digital controlled amplification method using class D amplifiers.

Block diagram 800 of FIG. 8 illustrates another multi power amplifier output stage with class D amplifiers according to an embodiment of the present invention. Similarly to the embodiment of FIG. 7, the output stage 800 includes a plurality of PA branches 808-{1, ..., n}. Signals 801-{1, ..., n} incoming from respective the products of the constituent signals components by a periodic signal represent inputs for amplification stage 800. Referring FIGS. 2, 2A, 4, 4A, 6 and 6A, the input signals are the sets of signals 231, 232, 233, 234, 235 and 236, signals 237, 238 and 239, signals 448, 449, 450, 451, 452 and 453, signals 455, 456, 457, signals 658, 659, 660, 661, 662, 663 and signals 665, 666 and 667, respectively. According to this embodiment of the present invention, signals 801-{1, ..., n} represent the constant envelope constituent signals of a desired output signal of the power amplifier.

Each of PA branch 808-{1, ..., n} may include multiple power amplification stages represented by a limiter 802-(1, ..., n) that provides a signal 802-{1, ..., n} to the drivers in parallel 803-{1, ..., n} and 804-{1, ..., n} each one providing a input signal to the corresponding transistors TP-{1, ... n} and TN-{1, ..., n} of each signal power amplifier 806-{1, ..., n}. Each signal power amplifier 806-{1, ..., n} includes two transistors TP-{1, ..., n} and TN-{1, ..., n} followed by a capacitor C-{1, ..., n} and a inductance L-{1, ..., n}. Signal power amplifier 806-{1, ..., n} have supply tensions $V_{suppply1}, \ldots, V_{supplyn}$.

To generate the desired output signal, outputs of PA branches 807-{1, ..., n} are coupled at the combiner 809 to generate the output signal 810. Accordingly, minimal power loss is incurred in summing the outputs of PAs 807-{1, ..., n}.

In an embodiment the combiner 809 is a near zero-impedance conducting wire that provides minimal isolation between the coupled outputs.

Figure 9:
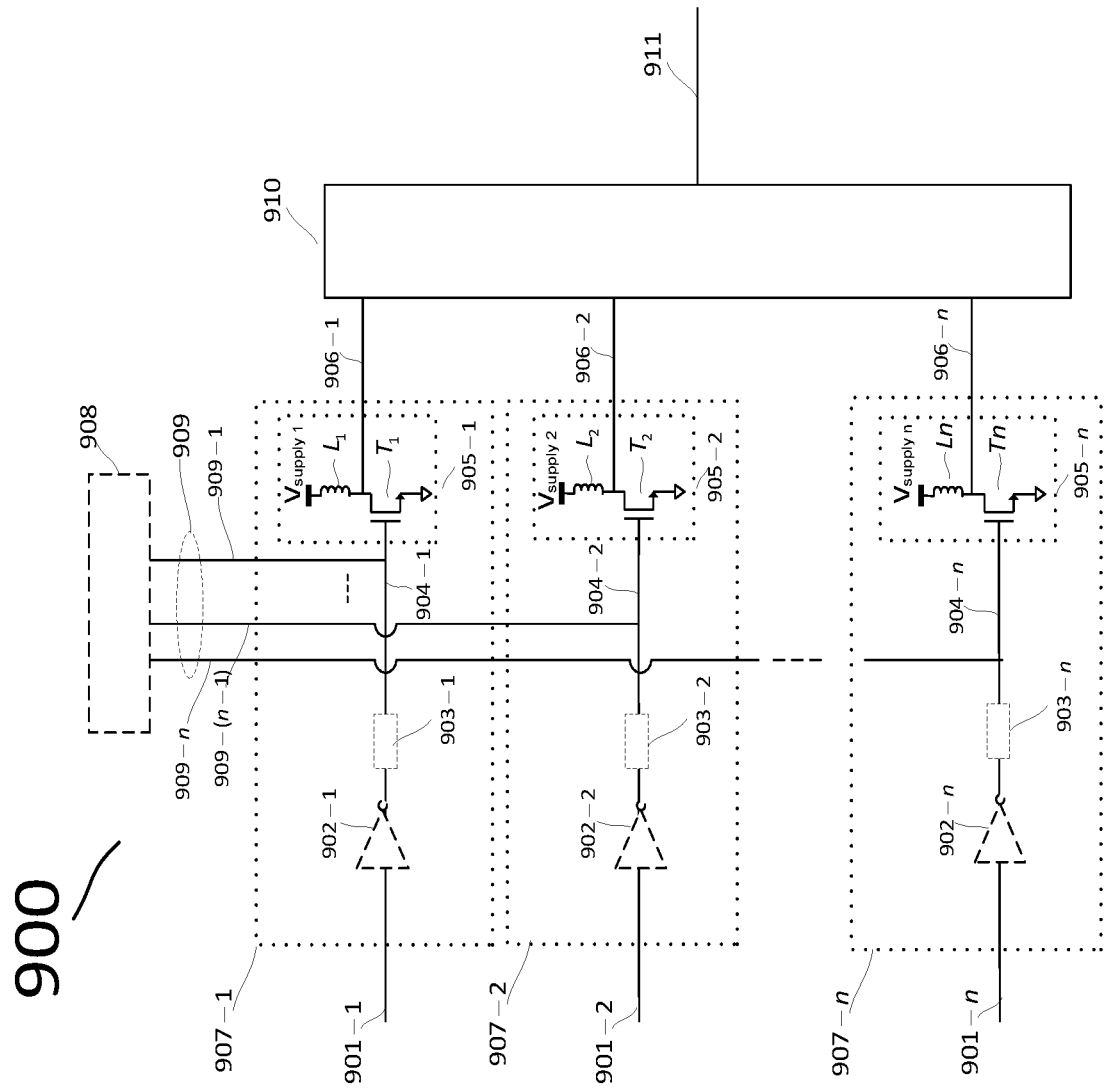
FIG. 9 is a block diagram that illustrates another exemplary embodiment for implementing a power amplification stage of analog to analog converter with quantized digital controlled amplification method using class A, B, AB, C or class E amplifiers.

Block diagram 900 of FIG. 9 illustrates another multi amplifier amplification stage embodiment with class A, B, AB or C amplifiers according to the present invention. Similarly to the embodiment of FIG. 7, the multi amplifier amplification stage 900 includes a plurality of PA branches 907-{1, ..., n}. Signals 901-{1, ..., n} incoming from respective the products of the constituent signals components by a periodic signal represent inputs for amplification stage 900. Referring FIGS. 2, 2A, 4, 4A, 6 and 6A, the input signals are the sets of signals 231, 232, 233, 234, 235 and 236, signals 237, 238 and 239, signals 448, 449, 450, 451, 452 and 453, signals 455, 456, 457, signals 658, 659, 660, 661, 662, 663 and signals 665, 666 and 667, respectively. According to this embodiment of the present invention, signals 901-{1, ..., n} represent the quasi constant or constant envelope constituent signals of a desired output signal of the power amplifier.

Each of PA branches 907-{1, ..., n} may include multiple power amplification stages represented by a driver 902-{1, ..., n}, a matching impedance 903-{1, ..., n} and power amplifier 905-{1, ..., n}. According to embodiment 900, PAs 905-{1, ..., n} include FET devices T1, ..., Tn. In the example of FIG. 9, power amplifiers 905-{1, ..., n} include FET devices T1, ..., Tn, inductances L1, ..., Ln, and supply tensions $V_{suppply1}$, ..., $V_{supplyn}$. The multi amplifier amplification stage embodiment 908 includes a bias control circuit network 909-{1, ..., n} that provides bias signals 909-{1, ..., n} coupled to each PA 905-{1, ..., n} in each PA branch 907-{1, ..., n}. To generate the desired output signal, outputs of PA branches 906-{1, ..., n} are coupled at the combiner 910 to generate the output signal 911. Accordingly, minimal power loss is incurred in summing the outputs of PAs 906-{1, ..., n}.

Figure 10:
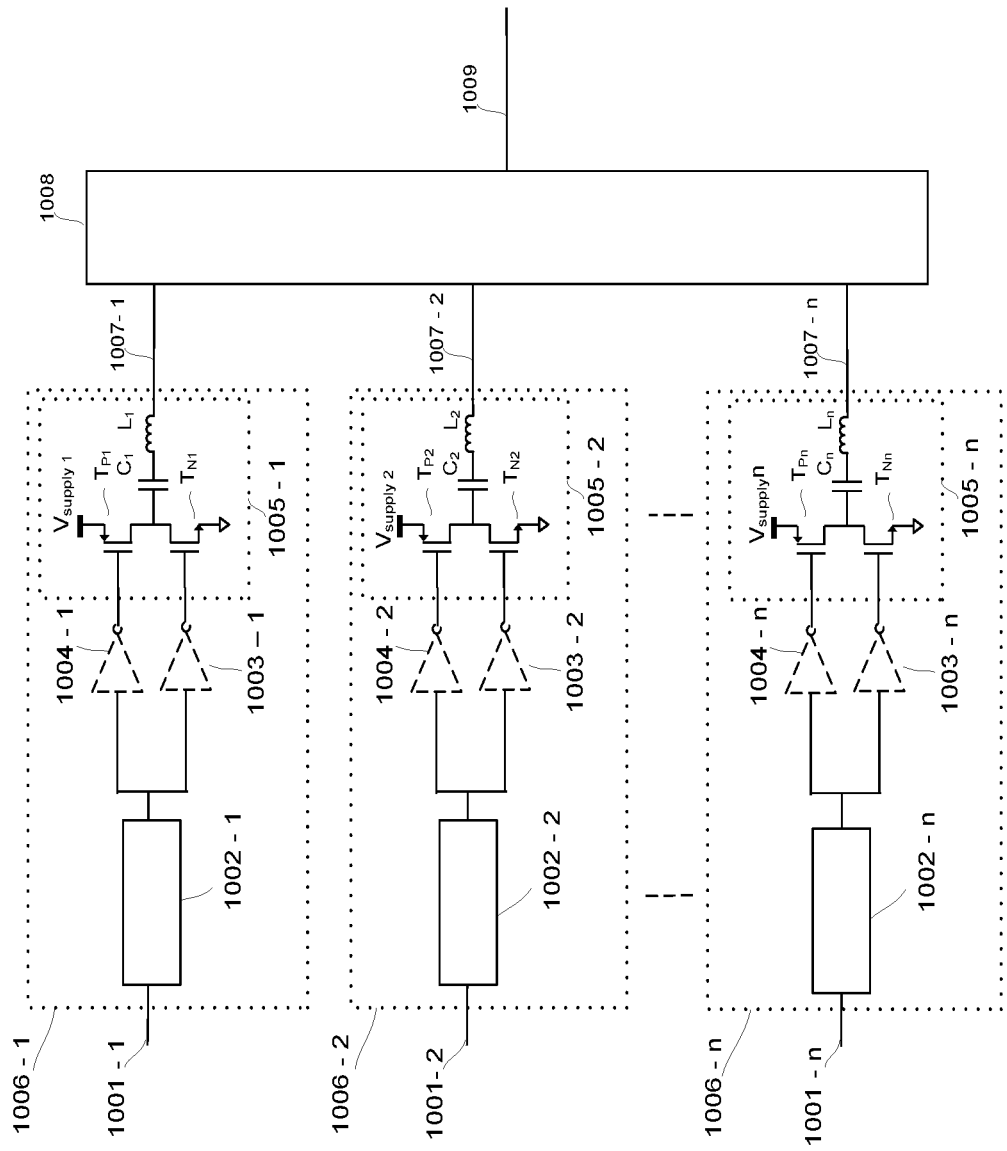
FIG. 10 is a block diagram that illustrates another exemplary embodiment for implementing a power amplification stage of analog to analog converter with quantized digital controlled amplification method using class S amplifiers.

Block diagram 1000 of FIG. 10 illustrates another multi amplifier amplification stage embodiment according to the present invention. Similarly to the embodiment of FIG. 7, output stage 1000 includes a plurality of PA branches 1006-{1, ..., n}. Each of PA branches 1006-{1, ..., n} may include multiple power amplification stages represented a delta sigma modulator 1002-{1, ..., n}, two drivers in parallel 1003-{1, ..., n} and 1004-{1, ..., n} and a PA 1005-{1, ..., n} composed by two transistors TP-{1, ..., n} and TN-{1, ..., n} in parallel followed by a capacitor C-{1, ..., n} and an inductance L-{1, ..., n}.

According to embodiment 1000, PAs 1005-{1, ..., n} include switching power amplifier stages. In the example of FIG. 10, power amplifiers 1005-{1, ..., n} include FET devices TP1, ..., TPn and TN1, ..., TNn, respectively channel P and channel N. The complementary stack arrangement of P and N type channel transistors forms a class D based stage, taking advantage of the efficiency associated with this type of amplification stage.

To generate the desired output signal, outputs of PA branches 1007-{1, ..., n} are coupled at the combiner 1008 to generate the output signal 1009. Accordingly, minimal power loss is incurred in summing the outputs of PAs 1007-{1, ..., n}.

Embodiments are not limited to one type of FET channel N devices as described herein. A person skilled in the art will appreciate, for example, that embodiments of the present invention may be implemented using npn or pnp Bipolar Junction Transistors (BJTs), complementary MOS (CMOS), N-type MOS (NMOS), positive channel MOS (PMOS), Laterally Diffused MOS (LDMOS), BiCMOS or other type of transistors. Further, embodiments can be implemented using GaAs, Gallium nitride (GaN) and/or SiGe (silicon-germanium) transistors with the desired transistor switching speed being a factor to consider.

In embodiments, the number of transistors included within each PA is set according to a required maximum output power level of the power amplifier. In other embodiments, the number of transistors in the PA is such that the numbers of transistors in the pre-driver, driver, and PA stages conform to a geometric progression.

While preferred embodiments of the present disclosure have been described above, the present disclosure is not limited to the specific configurations described above. Various variations and modifications may be made without departing from the scope of the present disclosure. It should be understood by those skilled in the art that various modifications, combinations, sub-combinations and alterations may occur depending on design requirements and other factors insofar as they are within the scope of the appended claims or the equivalents thereof.

4. SUMMARY

Mathematical basis for a new concept related to processing signals to provide power amplification is provided herein. These new concepts permit arbitrary waveforms to be constructed from sums of waveforms which are substantially constant envelope in nature. Desired output signals and waveforms may be constructed from substantially constant envelope constituent signals which can be created from the knowledge and quantization of the time varying envelope of the input signal. Constituent signals of the quantized signal are generated and summed using novel techniques not available commercially, not taught or found in literature or related art. Furthermore, the blend of various techniques and circuits provided in the disclosure provide unique aspects of the invention which permits superior linearity, power added efficiency, monolithic implementation and low cost. Embodiments of the invention can be implemented by a blend of hardware, software and firmware. Both digital and analog techniques can be used with or without microprocessors and DSP's (digital signal processors).

Embodiments of the invention can be implemented for communications systems and electronics in general. In addition, and without limitation, mechanics, electro mechanics, electro optics, and fluid mechanics can make use of the same principles for efficiently amplifying and transducing signals.

5. CONCLUSIONS

The present invention has been described above with the aid of functional building blocks illustrating the functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One person skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of power amplification, comprising:
   receiving an input signal carrying the information bits to be transmitted;
   receiving a first clock signal with value set according to the signal frequency of the input signal;
   receiving a second clock signal with value set according to a desired sampling rate of the input signal;
   receiving a third clock signal in accordance with a desired output signal frequency of the desired output signal;
   sampling said input signal carrying the information bits in accordance with the said sampling rate to generate the samples of the input signal;
   quantizing the samples of the input signal to generate the $N_b$ quantization bits that correspond to the quantized symbol;

processing individually the quantized bits and said first and second clock signals to generate the corresponding polar representation of each quantization bit;

processing the quantized samples and $N_b$ quantization bits to generate a first set of $N_b$ digital control signals to control the amplitude and phases of the said polar signals and to generate a second set of $N_b$ digital control signals to control the power supply voltage and the current to be applied in each amplifier in each branch of a multi amplifier amplification (MAA) stage comprising at least $N_b$ active amplification branches, having each set of digital control signals at least a number of digital control signals equal to the number of quantization bits;

processing the quantized samples and $N_b$ quantization bits to generate a third set of $N_b$ digital control signals to control the combination of the signals after the MAA stage;

processing in a constituent signal mapper the polar signals and said first set of digital control signals and said first and third clock signal to generate the $N_b$ substantially constant envelope constituent signals components in each quantized sample is decomposed, where the constituent signals components may assume $N_b$ different values for phases and $N_b$ possible different amplitudes belonging to a fixed alphabet;

providing the said second set of digital control signals to control the power supply voltage and current applied in each amplifier in each branch of the said MAA stage;

processing in a combiner the amplified signals of the said substantially constant envelope constituent signals, where are combined to create a desired output signal according the with the control information of the said third set of digital control signals.

2. The method according to claim 1, wherein said step of receiving said input signal carrying the information bits comprises:

receiving one band limited information signal-with time varying envelope or receiving the in-phase and quadrature phase components of one band limited information signal with time varying envelope or receiving the samples of in-phase and quadrature components of one information band limited signal with time varying envelope or comprises receiving the samples of one information band limited signal with time varying envelope.

3. The method according to claim 1, wherein substantially constant envelope constituent signals may be quadrature shift keying signals (QPSK), or offset QPSK signals, or minimum shift keying (MSK) signals or Gaussian MSK or equivalent signals designed to have low envelope fluctuations and compact spectrum.

4. The method according to claim 1, wherein said step of quantizing the samples of said input signal carrying information bits to generate the quantization bits uses a number of quantization bits that may change between different samples of the said input signal carrying the information bits.

5. The method according to claim 1, further comprising a filter after the combiner to perform the spectral shaping of said desired output signal.

6. The method according to claim 1, further comprising said second set of digital control signals to control the power supply voltage and the current to be applied in each amplifier in each branch of the MAA to vary power output of each branch.

7. The method according to claim 1, wherein:

said step of sampling comprises sampling the said input signal in accordance with the said sampling rate to generate the samples of the in-phase and quadrature components of the input signal;

said step of quantization comprises two quantizers where one quantizes each sample of in-phase component and generates $N_b$ quantization bits that correspond to the quantized version of the sample and another quantizer that quantizes each sample of quadrature component to generate $N_b$ quantization bits that correspond to the quantized version of the sample of quadrature component;

said step of processing the quantization bits involves processing individually the $N_b$ quantization bits of in-phase and quadrature components to generate the corresponding polar representation of each quantization bit;

said step of processing the quantized samples comprises processing each quantized sample of in-phase and quadrature components and the quantization bits to generate a first set of 2 $N_b$ digital control signals to control the amplitude and phases of the said polar signals, associated to each component;

said step of processing the quantized samples comprises processing each quantized sample of in-phase and quadrature components and the quantization bits to generate a second set of $N_b$ digital control signals to control the power supply voltage and current to be applied in each amplifier of said MAA stage;

processing individually the two sets of quantized bits to generate the $N_b$ polar signals associated to the sample of the in-phase component and to generate the $N_b$ polar signals associated to the sample of the quadrature component;

said constituent signal mapper comprises two signal mappers, where one processes the polar signals and said first set of digital control signals to generate a plurality of constituent signals components in which the quantized sample of the in-phase is decomposed and a second one that processes the polar signals and said first set of digital control signals to generate a plurality of constituent signals components in which the quantized sample of the quadrature component is decomposed, where the constituent signals components may have only a discrete number of amplitudes and discrete number of phases belonging to two sets of phases and amplitudes values with a maximum size equal to the number of quantization bits;

in-phase and quadrature constituent signals components with same amplitude are summed to generate a set of $N_b$ substantially constant envelope constituent signals whose sum is equal to the quantized sample of the signal;

processing the substantially constant envelope constituent signals, by multiplying the signals by a periodic pulse signal with the desired output signal frequency;

providing each one of said substantially constant envelope constituent signals to a multi amplifier amplification (MAA) stage, comprising at least $N_b$ active amplification branches with different power outputs levels, wherein each one of the said constituent signals component is amplified by the amplifier of his branch.

8. The method according to claim 7, wherein the number of said constituent signals of each quantized sample of in-phase and quadrature comprises at least four constituent signals where two are in-phase constituent signals and other two are quadrature constituent signals.

9. The method according to claims 1 and 7, wherein bandpass filters can be coupled to each amplification branch of the MAA stage to filter the amplified signals at each branch and format the spectrum according the desired spectral mask for each signal.

10. An apparatus for power amplification, comprising:
an input circuitry that receives an input signal carrying the information bits to be transmitted;
an input circuitry that receives a clock signal with value set according to the signal frequency of the input signal,
an input circuitry that receives a clock signal with value set according to a desired sampling rate of the input signal;
an input circuitry that receives a clock signal in accordance with a desired output signal frequency of the desired output signal;
a sampling circuitry that samples the input signal carrying the information in accordance with the said sampling rate to generate the samples of the input signal;
a quantizer coupled to the input circuitry that quantizes the samples and generates the quantization bits that correspond to the quantized symbol;
a polar converter circuitry that processes individually the $N_b$ quantization bits and generates the corresponding polar representation of each quantization bit;
a circuitry that process the quantized samples and generates a first set of $N_b$ digital control signals to control the amplitude and phases of the said polar signals at the output of the polar converter circuitry;
a circuitry that process the quantized samples and the $N_b$ quantization bits to generate a second set of digital control signals to be used by a bias circuitry to control the power supply voltage and current to be applied in each amplifier in each branch of a multi amplifier amplification (MAA) stage with $N_b$ active amplification branches;
a circuitry that process the quantized samples and the $N_b$ quantization bits to generate a third set of digital control signals to be used by a combiner circuitry coupled to the outputs of the MAA stage;
a constituent signal mapper circuitry, coupled to the quantizer circuitry, that process the said polar signals and said first set of digital control signals to generate a plurality of constituent signals components associated to the decomposition of the quantized sample, where corresponding constituent signals components may have only a number of discrete phases and a number of discrete amplitudes equal to the number of quantization bits;
a multi amplifier amplification (MAA) stage circuitry that receives said substantially constant envelope constituent signals, comprising at least $N_b$ active amplification branches with different power outputs levels, wherein each one of the said substantially constant envelope constituent signal components is amplified by the amplifier of his branch;
a combiner circuitry coupled to the branches of MAA stage that combines the outputs of the branches of said MAA stage according the said third set of digital control signals;
a filter coupled to the output of said combiner's circuitry to filter the resulting signal according the desired spectral mask for the output signal.

11. The apparatus of claim 10, wherein said received input signal carrying the information bits by input circuitry comprises:
receiving one band limited information signal-with time varying envelope or receiving the in-phase and quadrature phase components of one band limited information signal with time varying envelope or receiving the samples of in-phase and quadrature components of one information band limited signal with time varying envelope or comprises receiving the samples of one information band limited signal with time varying envelope.

12. The apparatus of claim 10, wherein:
said quantization circuitry comprises two quantizers circuits in parallel where one quantizes the sample of in-phase component and generates $N_b$ quantization bits that correspond to the quantized version of the sample and another quantizer that quantizes each sample of quadrature component to generate $N_b$ quantization bits that correspond to the quantized version of the sample of quadrature component;
said polar converter circuitry includes two polar converters, with one associated to the polar signals of the $N_b$ quantization bits of in-phase component and another associated to the polar signals of the $N_b$ quantization bits of quadrature;
said constituent signal mapper circuitry comprises two signal mappers circuits in parallel, with each one coupled to one of the quantizers, where one processes the polar signals and said first set of digital control signals to generate a plurality of constituent signals components in which the quantized sample of the in-phase is decomposed, and a second one that processes the polar signals and said first set of digital control signals to generate a plurality of constituent signals components in which the quantized sample of the quadrature component is decomposed, where the constituent signals components may have only a discrete number of amplitudes and discrete number of phases belonging to two sets of phases and amplitudes values with a maximum size equal to the number of quantization bits;
a circuitry that combines the in-phase's constituent signals components and quadrature's constituent signals components with same amplitude, that result from the said constituent signal mapper circuitry, to generate a set of substantially constant envelope constituent signals who's the sum is equal to the quantized sample of the signal.

13. The apparatus of claim 10, further comprising a biasing control circuitry coupled to said MAA stage, wherein said biasing control circuitry operates according to one or more biasing control functions of said second set of digital control signals to control the power supply voltage and the current affecting each amplifier in each branch.

14. The apparatus of claim 10, further comprising:
a bandpass filter coupled to each amplification branch of said MAA stage to filter each signal according the desired spectral mask for the output signal.

15. The apparatus of claim 10, wherein said mapper circuitry comprises one or more look up tables which are used to process quantization bits and said first set of digital control signals.

16. The apparatus of claim 10, wherein said each MAA stage's branch comprises one or more power amplification sub-stages with one or more transistors.

17. The apparatus of claim 10, further comprising:
means for dynamically controlling said transistors of said circuit branches to thereby transition operation of said transistors along an operational range that includes switching amplifier operation and current source amplifier operation.

18. The apparatus of claim 10, wherein said MAA stage comprises a plurality of said amplifiers from a group comprising:
class A signal amplifiers;
class B signal amplifiers;
class AB signal amplifiers;
class D signal amplifiers;
class F signal amplifiers;
class E signal amplifiers;
class S signal amplifiers;
class C signal amplifiers.

19. The apparatus of claim 10, wherein said MAA stage comprises a plurality of bipolar junction transistors (13.11s) of type NPN.

20. The apparatus of claim 10, wherein said MAA stage comprises a plurality of bipolar junction transistors (13.11s) of type PNP.

21. The apparatus of claim 10, wherein said MAA stage comprises a plurality of bipolar junction transistors (13.11s) of type NPN or PNP.

22. The apparatus of claim 10, wherein said MAA stage comprises a plurality of Field Effect Transistors (FETs) with N or P Channels.

23. The apparatus of claim 10, wherein said MAA stage comprises a plurality of Field Effect Transistors (FETs) with N or P Channels, namely using silicon based on metal-oxide-semiconductor (MOS) technology.

24. The apparatus of claim 10, wherein said MAA stage comprises a plurality of Field Effect Transistors (FETs) with N or P Channels, namely using silicon based on metal-oxide-semiconductor (MOS) technology.

25. The apparatus of claim 10, wherein said MAA stage comprises a plurality of Field Effect Transistors (FETs) with N or P Channels, namely using Gallium arsenide (GaAs) technology, Gallium nitride (GaN) technology and/or silicon-germanium (SiGe) technology.

* * * * *